US007776692B2

(12) United States Patent
Yoon et al.

(10) Patent No.: US 7,776,692 B2
(45) Date of Patent: Aug. 17, 2010

(54) SEMICONDUCTOR DEVICE HAVING A VERTICAL CHANNEL AND METHOD OF MANUFACTURING SAME

(75) Inventors: Jae-man Yoon, Seoul (KR); Bong-soo Kim, Seongnam-si (KR); Hyeoung-won Seo, Yongin-si (KR); Kang-yoon Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 568 days.

(21) Appl. No.: 11/702,601

(22) Filed: Feb. 6, 2007

(65) Prior Publication Data
US 2007/0181925 A1 Aug. 9, 2007

(30) Foreign Application Priority Data
Feb. 9, 2006 (KR) .................. 10-2006-0012578

(51) Int. Cl.
*H01L 29/94* (2006.01)
(52) U.S. Cl. .................. 438/270; 438/243; 257/296; 257/302
(58) Field of Classification Search ......... 257/135–136, 257/242, 296, 302–303, 306, 310, 329, 330, 257/911, 920, E27.091, E27.095–E27.096, 257/E29.118, E29.274, E29.313, E29.318, 257/E29.262; 438/136, 137, 156, 173, 192, 438/206, 212
See application file for complete search history.

(56) References Cited
U.S. PATENT DOCUMENTS

| 4,974,060 | A | * | 11/1990 | Ogasawara | 257/296 |
| 6,018,174 | A | * | 1/2000 | Schrems et al. | 257/296 |
| 6,114,725 | A | * | 9/2000 | Furukawa et al. | 257/330 |
| 6,218,236 | B1 | | 4/2001 | Economikos et al. | |
| 6,337,497 | B1 | | 1/2002 | Hanafi et al. | |
| 7,531,874 | B2 | * | 5/2009 | Son et al. | 257/334 |
| 2005/0186740 | A1 | * | 8/2005 | Kim | 438/270 |
| 2007/0080385 | A1 | * | 4/2007 | Kim et al. | 257/296 |

FOREIGN PATENT DOCUMENTS

KR 100147584 B1 5/1998

* cited by examiner

*Primary Examiner*—David Vu
*Assistant Examiner*—Jonathan Han
(74) *Attorney, Agent, or Firm*—Volentine & Whitt, PLLC

(57) ABSTRACT

A semiconductor device having a vertical channel capable of reducing the interface contact resistance between a gate electrode surrounding an active pillar and a word line connecting the gate electrode and a method of manufacturing the same is provided. The semiconductor device includes a plurality of active pillars extending in a direction perpendicular to a surface of a semiconductor substrate. A word line structure is formed on an outer periphery for connecting the active pillars disposed in the same row or column. Top and bottom source/drain regions are formed over and under the active pillars, respectively, in relation to the word line structure.

17 Claims, 31 Drawing Sheets

SEMICONDUCTOR DEVICE HAVING A VERTICAL CHANNEL AND METHOD OF MANUFACTURING SAME

BACKGROUND OF THE INVENTION

1. Field of the Invention

The present invention relates to a semiconductor device having a vertical channel and, more particularly, to a semiconductor device having a vertical channel capable of reducing the interface resistance between a gate electrode and a word line and a method of manufacturing the same.

This application claims the benefit of Korean Patent Application No. 10-2006-0012578, filed on Feb. 9, 2006, in the Korean Intellectual Property Office, the disclosure of which is incorporated herein in its entirety by reference.

2. Discussion of Related Art

With the increase of integration density of semiconductor devices, the size of a MOS transistor (i.e., the channel length of a MOS transistor), has become smaller and smaller in order to accommodate more devices integrally formed within a defined space. Generally, the integration density of a semiconductor device increases as the channel length of the MOS transistor is reduced. However, as the channel length decreases a short channel effect incidentally occurs such as drain induced barrier lowering (DIBL), hot carrier effect, punch through, or the like. This short channel effect causes the semiconductor device to operate abnormally. In order to prevent short channel effects, various methods have been developed, for example junction region depth reduction, extending the channel length by forming grooves in a channel region.

However, as the semiconductor memory device has high integration density in the gigabit range, a MOS transistor having a channel length less than a critical dimension obtained by photolithography is required. For this reason, it is difficult to utilize a planar type MOS transistor to gigabit memory devices where the source and drain regions are formed on the same plane. To overcome these deficiencies, a vertical channel semiconductor device has been proposed in which source/drain regions are formed over and under a gate electrode to form a vertical channel.

The vertical channel semiconductor device (e.g. a vertical channel MOS transistor) includes an active pillar which extends perpendicularly to a main surface of the semiconductor substrate. The gate electrode is formed around the active pillar and the source/drain regions are formed on top and bottom portions of the active pillar in relation to the gate electrode. By forming a vertical channel, the channel length itself is not shortened even though the size of the MOS transistor is reduced. In addition, a bit line is formed in the bottom source/drain region by the gate electrode surrounding the active pillar using a self-aligning method. A word line is also formed such that the word line electrically connects the gate electrodes disposed in the same row or column with respect to one another. However, as the bit line is self-aligned by the gate electrode, the gate electrode and the word line are formed of different materials. As a result, an interface resistance between the gate electrode and the word line increases. If the gate electrode and the word line are formed of the same material, a contact interface exists between the gate electrode and the word line so that the resistance therebetween inevitably increases. That is, the total resistance of the word line of the semiconductor device having the vertical channel may be represented as Equation 1:

$$RT = RWL + RG + R\text{Interface} \qquad [\text{Eq. 1}]$$

where RWL, denotes the total resistance of the word line, RG denotes the resistance of the gate electrode and RInterface denotes the interface contact resistance between the word line and the gate electrode.

As illustrated in the equation 1, the total resistance RT of the word line is affected by the interface contact resistance RInterface between the word line and the gate electrode. Because the interface contact resistance RInterface is considerably high, this causes a signal delay of the word line. Accordingly, a need exists to develop a semiconductor device having a vertical channel capable of preventing the delay of select signals by reducing the interface contact resistance (RInterface) between the word line and the gate electrode.

SUMMARY OF THE INVENTION

The present invention provides a semiconductor device and method of manufacturing a vertical channel capable of reducing signal delay by reducing an interface contact resistance between a gate electrode surrounding an active pillar and a word line connecting the gate electrodes to one another. A semiconductor device having a vertical channel provides a semiconductor substrate including a plurality of active pillars extending in a direction perpendicular to a surface of the semiconductor substrate. A word line structure surrounds the outer periphery of the active pillar where the word line structure connects the active pillars disposed in the same row or column to one another. Top and bottom source/drain regions are disposed over and under the active pillar, respectively. The word line structure may include a ring-shaped gate electrode surrounding the outer periphery of the active pillar, and a word line connecting the ring-shaped gate electrode disposed in a corresponding row or column. The ring-shaped gate electrode and the word line may be integrally formed without an interface therebetween to reduce contact resistance between the gate electrode and the wordline.

A method of manufacturing the semiconductor device is also provided where a plurality of active pillars are formed on the semiconductor which are spaced apart by a predetermined distance in row and column directions. An isotropic space is formed on a predetermined portion of a sidewall of the active pillar and a planarized conductive material layer fills the isotropic space and the space between the active pillars. A word line mask pattern is formed on the conductive material layer and a predetermined portion of the active pillar. A ring-shaped gate electrode is then formed in the isotropic space and a word line is formed by etching the conductive material layer using the word line mask pattern.

DESCRIPTION OF EMBODIMENTS

Figure 1A:
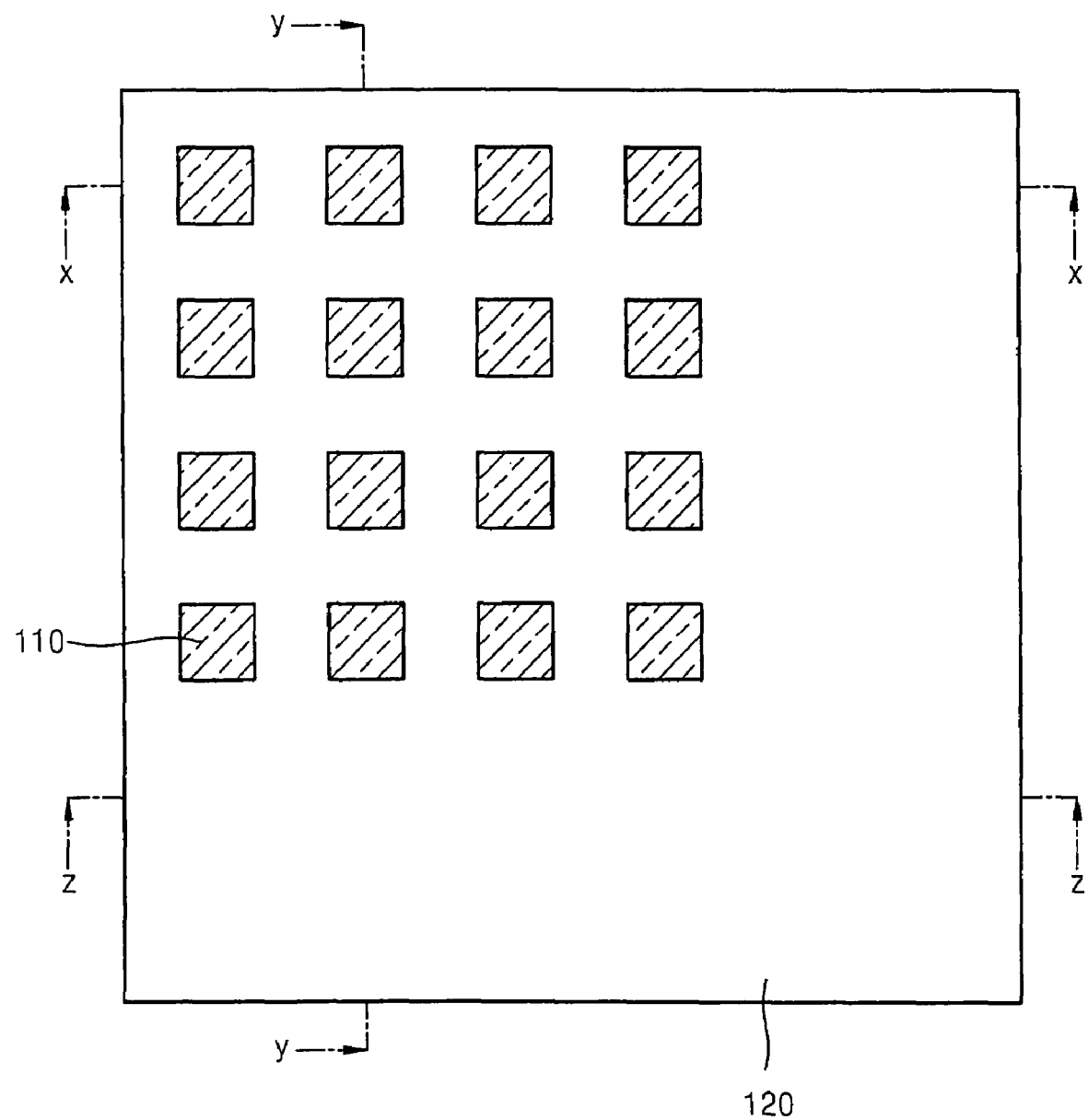
FIGS. 1A through 1G are plan views of a semiconductor device having a vertical channel according to an embodiment of the present invention.
Figure 1B:
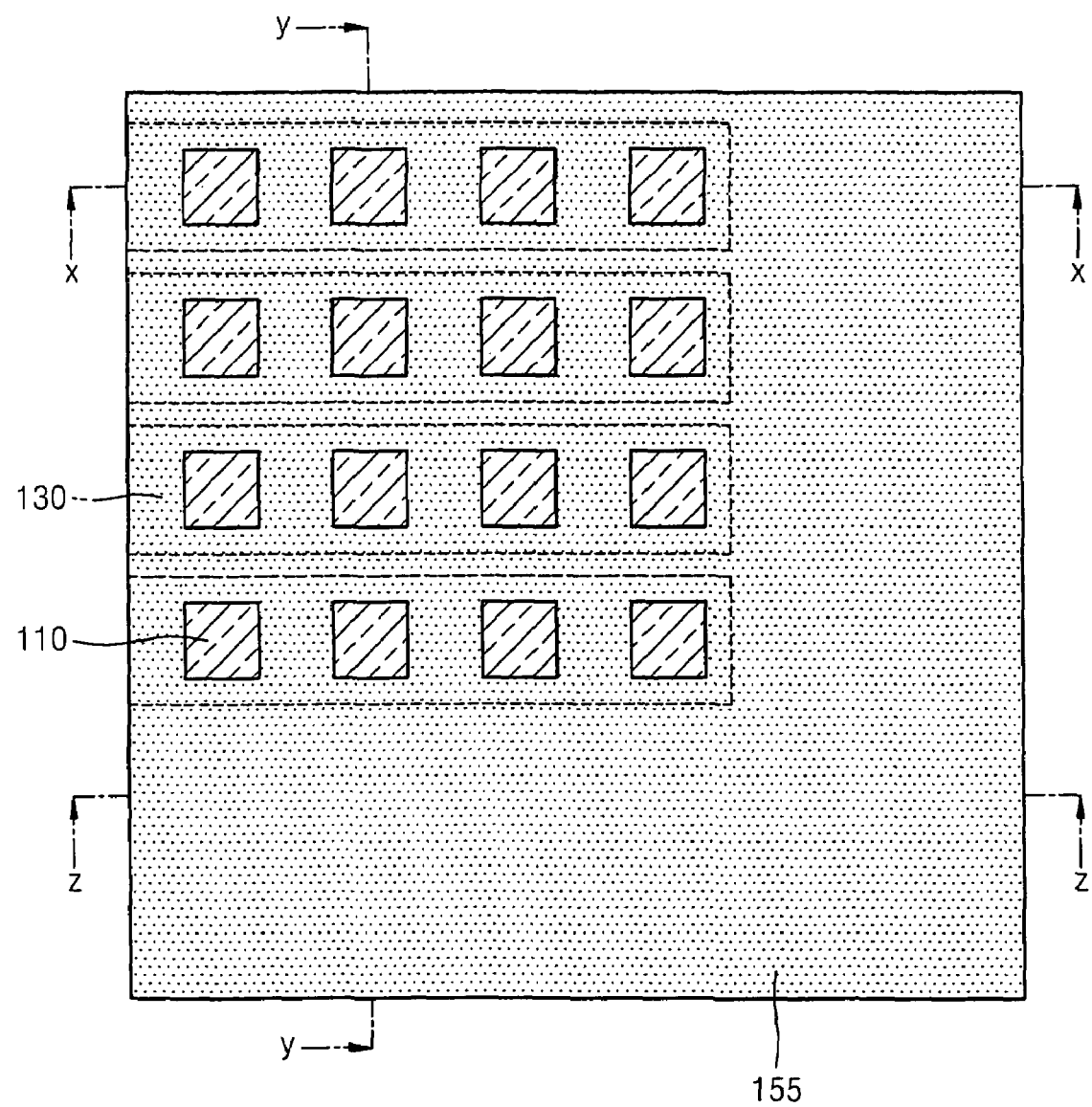
Figure 1C:
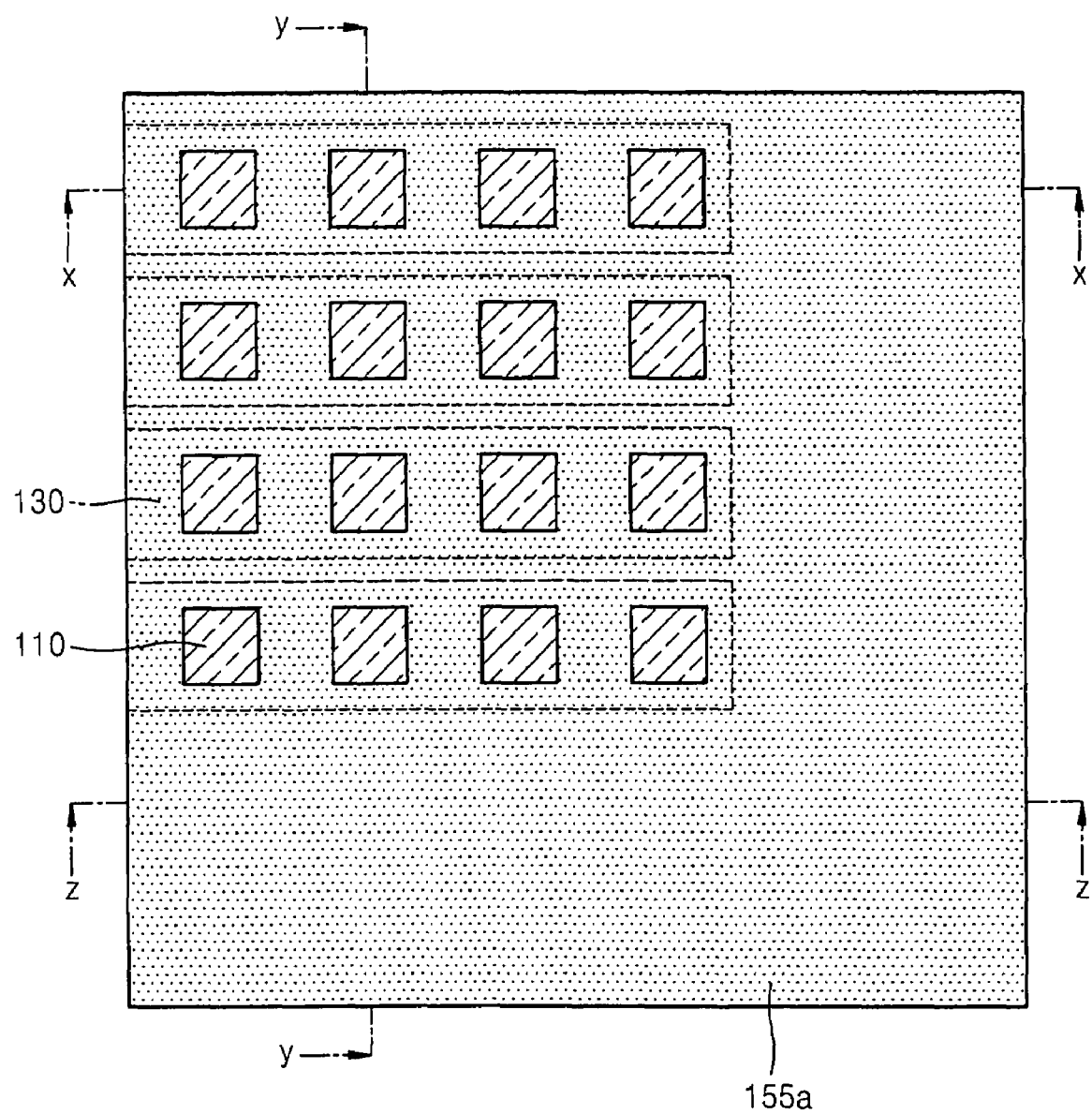
Figure 1D:
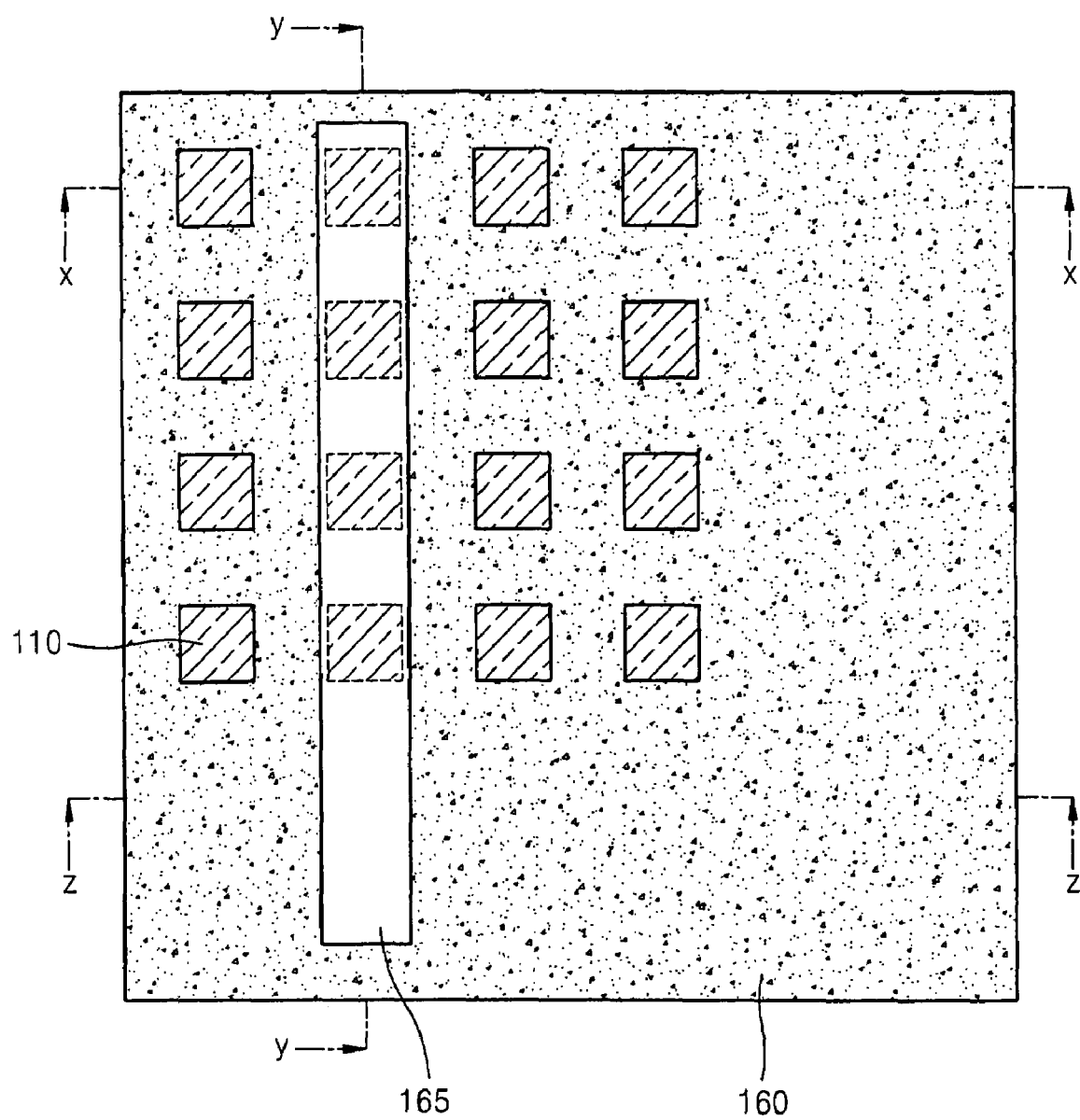
Figure 1E:
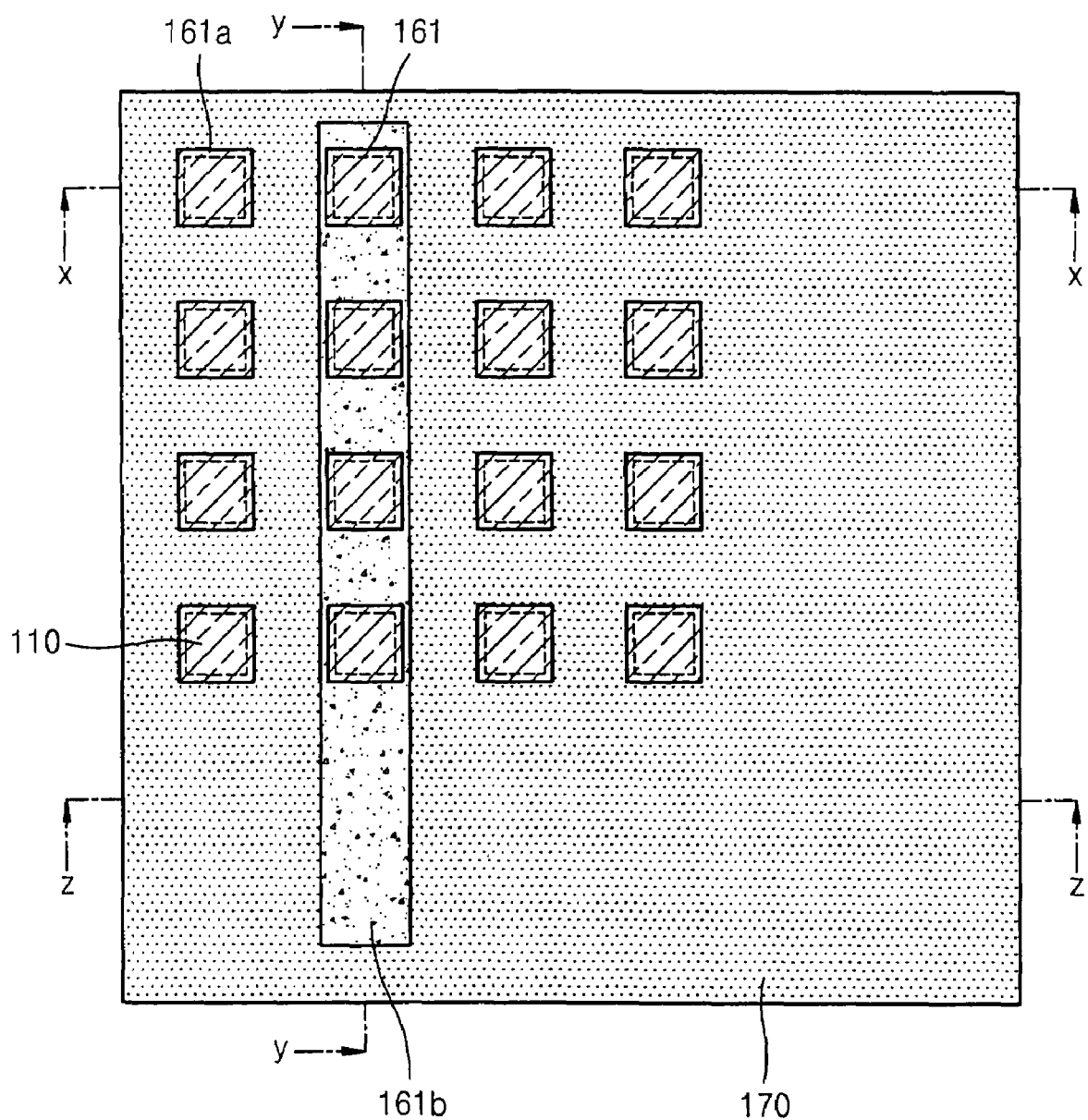
Figure 1F:
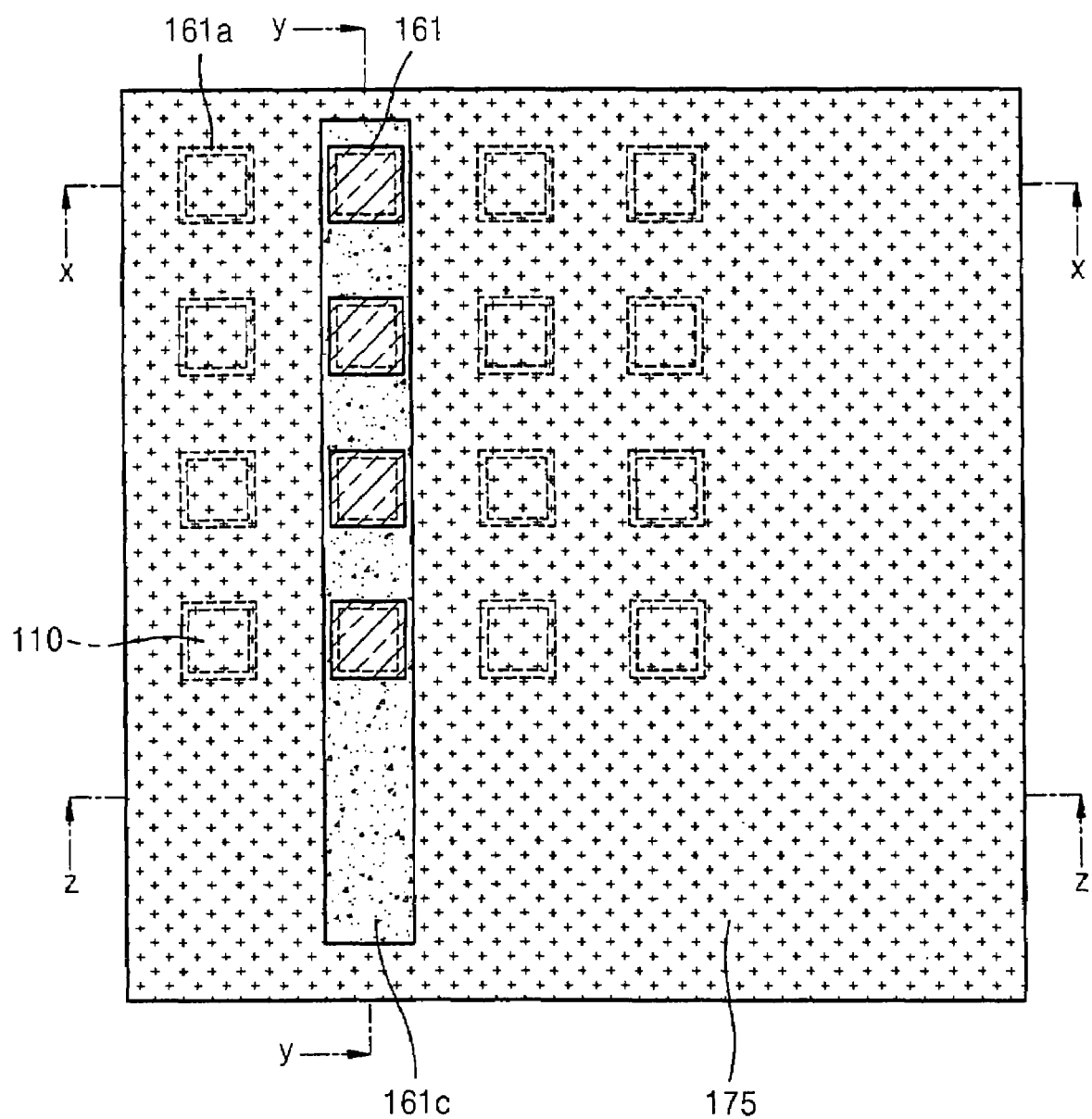
Figure 1G:
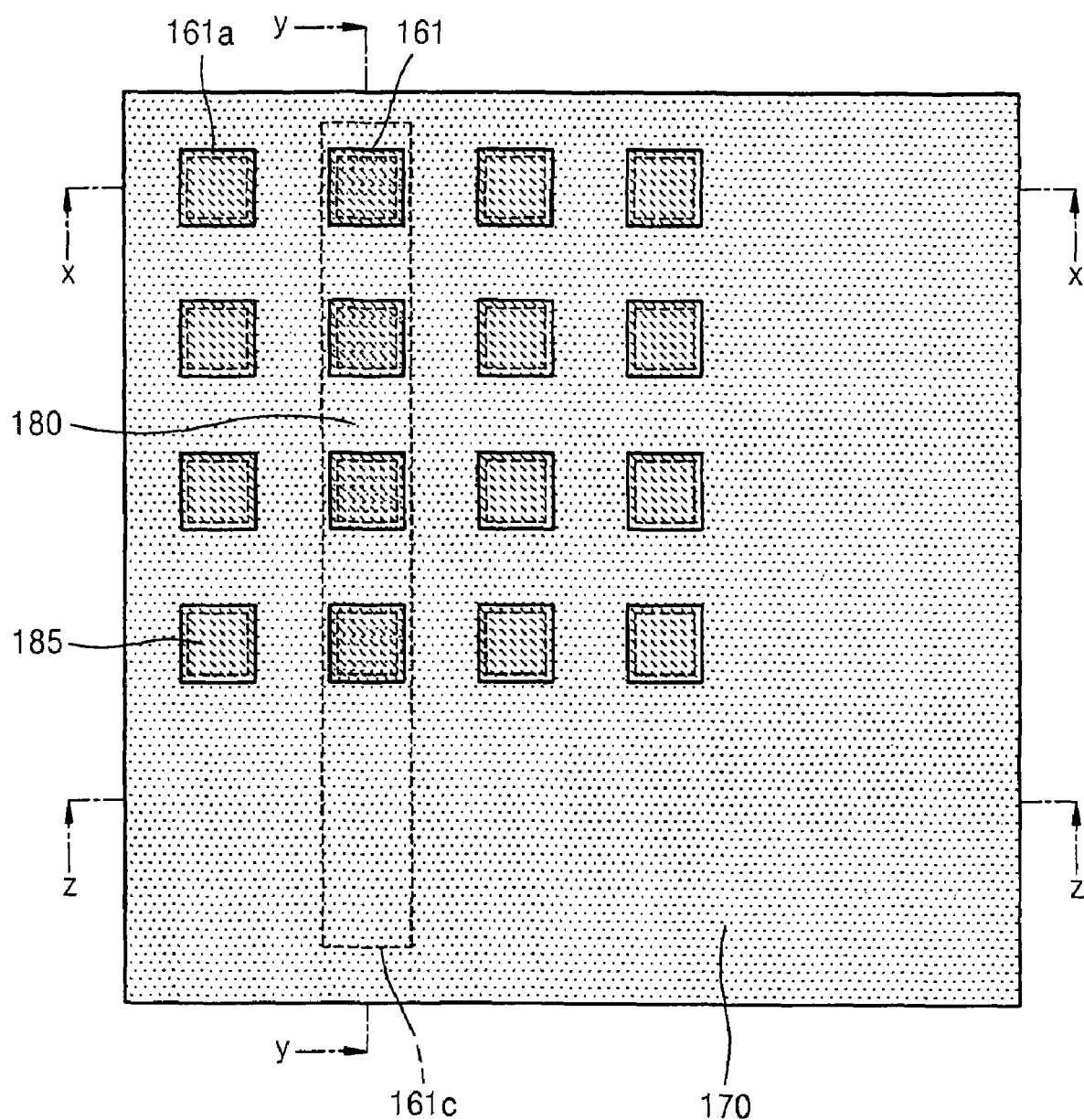

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Referring to FIGS. 1A, 2A, 3A and 4A, a pad oxide layer 105 is formed on a semiconductor substrate 100, and a plurality of hard mask patterns 110 are formed on the pad oxide layer 105. A silicon oxide layer or a silicon oxynitride layer may be used as hard mask pattern 110 which are spaced apart from each other by predetermined distances in the x-x' direction (hereinafter, referred to as "row direction") and y-y' direction (hereinafter, referred to as "column direction"), respectively. The width of one side of the hard mask pattern 110 may be, for example, a minimum feature size of 1F and the distance between adjacent hard mask patterns 110 may also be 1F. Therefore, a cell area that one unit cell having one hard mask pattern 110 occupies is 4F2.

An exposed semiconductor substrate 100 is etched to a relatively shallow depth for example, in a range of about 100 Å to 300 Å, using the hard mask pattern 110. A first insulating spacer 115 is formed such that it surrounds both the hard mask pattern 110 and the sidewall of the exposed semiconductor substrate 100. The semiconductor substrate 100 is then dry-etched to a predetermined depth, for example, in the range of about 800 Å to 1,500 Å using hard mask pattern 110 and the first insulating spacer 115 as a mask to form an upper pillar (or a preliminary pillar) 100a. Sidewall of exposed upper pillar 100a is isotropically etched using first insulating spacer 115 as a mask to form isotropic space S1. The isotropic etching may be performed such that an etched depth is in the range of about 150 Å to 500 Å. The first insulating spacer 115 positions isotropic space S1 at a position spaced apart from the upper portion of upper pillar 100a by a predetermined distance. A sacrificial gate insulating layer 120 is formed on the surface of semiconductor substrate 100 in which isotropic space S1 is provided. Thereafter, a gate material is deposited to a predetermined thickness to fill isotropic space S1 on the semiconductor substrate 100 on which the sacrificial gate insulating layer 120 is formed. The gate material may be, for example, polysilicon doped with n-type impurities, polysilicon doped with p-type impurities, silicon germanium, metal, metal silicide, etc. The gate material is anisotropically etched such that the hard mask pattern 110 and the sacrificial gate insulating layer 120 are exposed to form a sacrificial gate electrode 125 in isotropic space S1 wherein the sacrificial gate electrode 125 surrounds the upper pillar 100a. Impurities are implanted into the semiconductor substrate 100 between the upper pillars 100a surrounded by the sacrificial gate electrode 125 so as to form a bottom source/drain region 130. The implanted impurities may be, for example, phosphorus ions (31P) or arsenic ions (75As). The surface of the semiconductor substrate 100 into which the impurities are implanted is covered with the sacrificial gate insulating layer 120.

Referring to FIGS. 1B, 2B, 3B and 4B, a second insulating spacer 135 is formed on respective sidewalls of first insulating spacer 115 and sacrificial gate electrode 125. The second insulating spacer 135 may also be formed of a silicon oxide layer similar to first insulating spacer 115. A capping layer 132 formed of a silicon nitride layer may be additionally formed on the respective sidewalls of the first insulating spacer 115 and the sacrificial gate electrode 125 before formation of second insulating layer 135. A predetermined portion of semiconductor substrate 100 including the exposed bottom source/drain region 130 is etched to a desired depth using the second insulating spacer 135 as a mask to form active pillar 140. The formation of the active pillar 140 disposes the bottom source/drain region 130 in a particular row to be separate from the bottom source/drain region in other rows. In this manner, each source/drain region of a particular row is isolated. An embedded bit line 150 is selectively formed on the exposed semiconductor substrate 100 between active pillars 140. For example, the embedded bit line 150 may be formed through a selective silicide process after depositing a transition metal layer. The embedded bit line 150 is self-aligned by sacrificial gate electrode 125 and second insulating spacer 135 disposed on the sidewall thereof. Since the embedded bit line 150 is defined by second insulating spacer 135 having a uniform linewidth, it has a uniform width and thus, a uniform resistance distribution. A first interlayer insulating layer 155 is deposited over the resultant structure of the semiconductor substrate 100 and planarized such that the hard mask 110 is exposed. The first interlayer insulating layer 155 may have the same etch selectivity as second insulating spacer 135.

Figure 4A:
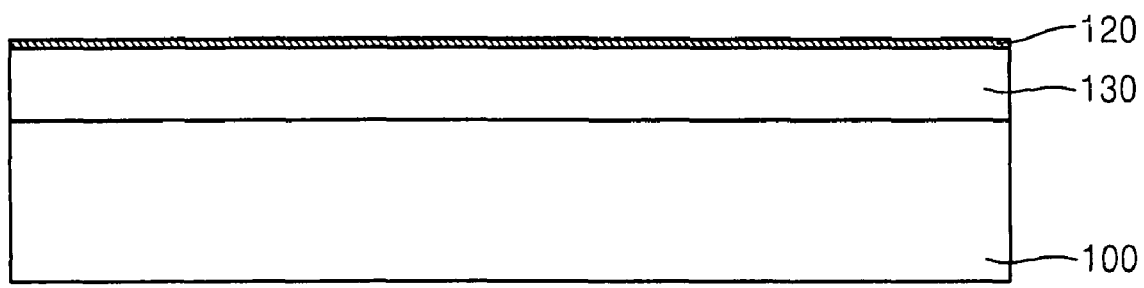
FIGS. 4A through 4H are cross-sectional views of the semiconductor device having the vertical channel according to an embodiment of the present invention taken along lines z-z' of FIGS. 1A through 1G.
Figure 4B:
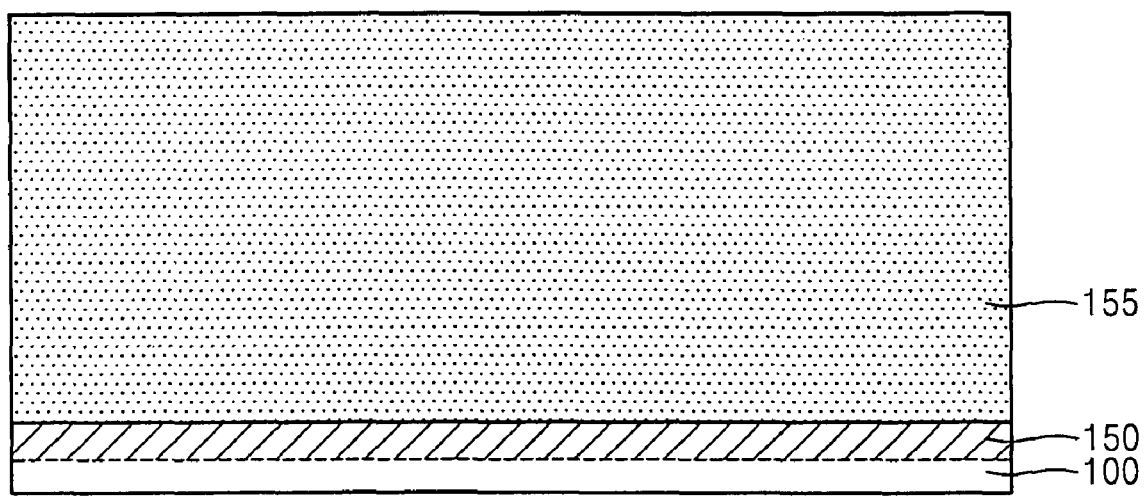
Figure 4C:
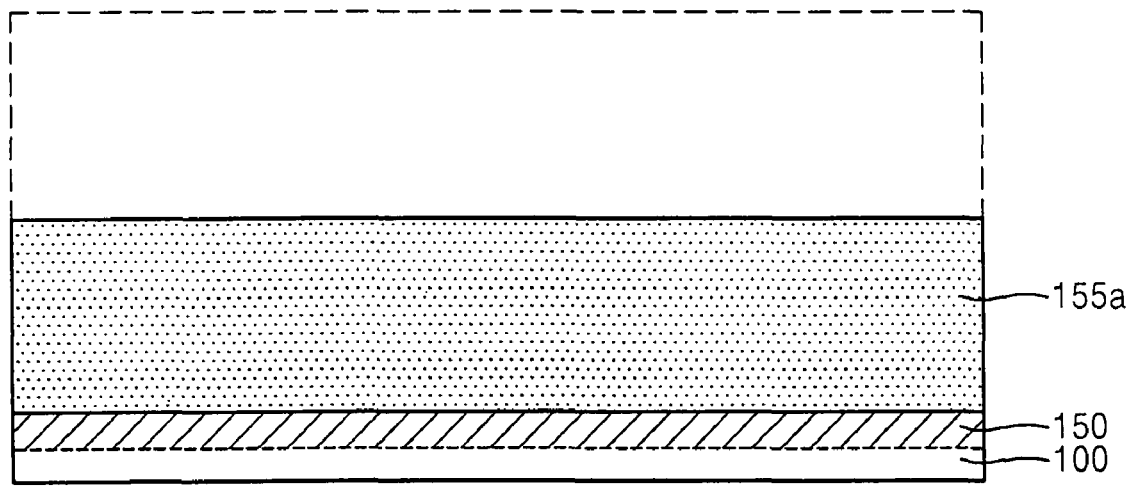

Referring to FIGS. 1C, 2C, 3C and 4C, first interlayer insulating layer 155 and second insulating spacer 135 are etched to a predetermined thickness such that the sidewall of sacrificial gate electrode 125 is partially exposed. The etching of the first interlayer insulating layer 155 may be performed using a wet etching process. In FIG. 4C, the dotted section denotes an upper portion of first interlayer insulating layer 155 before the etching process and a reference numeral 155a denotes a residue of the first interlayer insulating layer 155 after the etching process. Capping layer 132 plays a role in preventing the first insulating spacer 115 and the sacrificial gate insulating layer 120 from being lifted off while first interlayer insulating layer 155 is wet-etched.

Figure 2A:
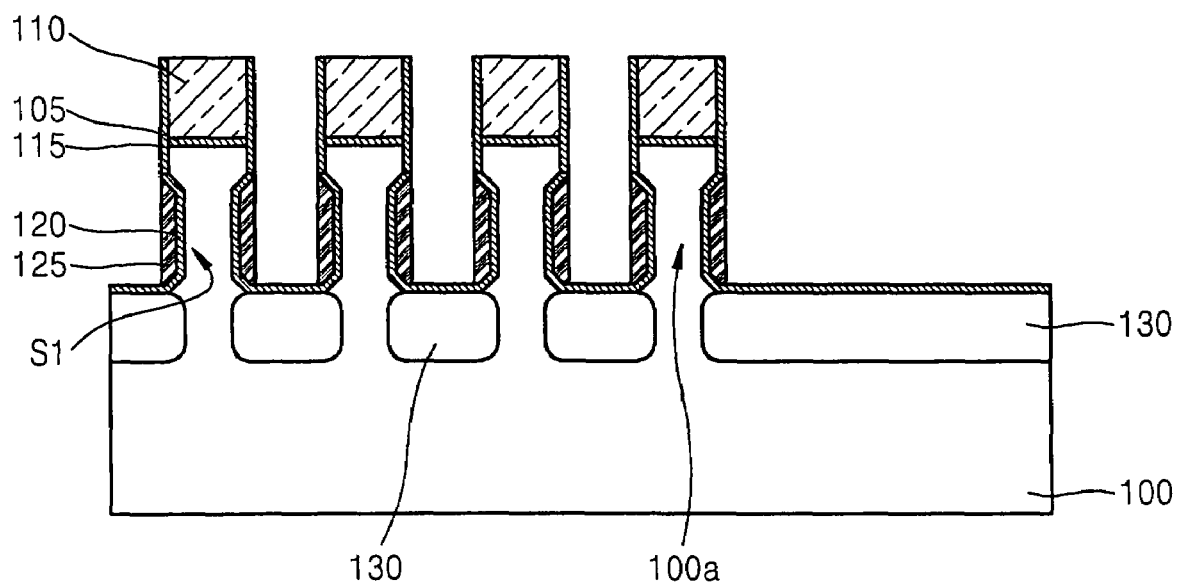
FIGS. 2A through 2H are cross-sectional views of the semiconductor device having the vertical channel according to an embodiment of the present invention, which are taken along the lines x-x' of FIGS. 1A through 1G.
Figure 2B:
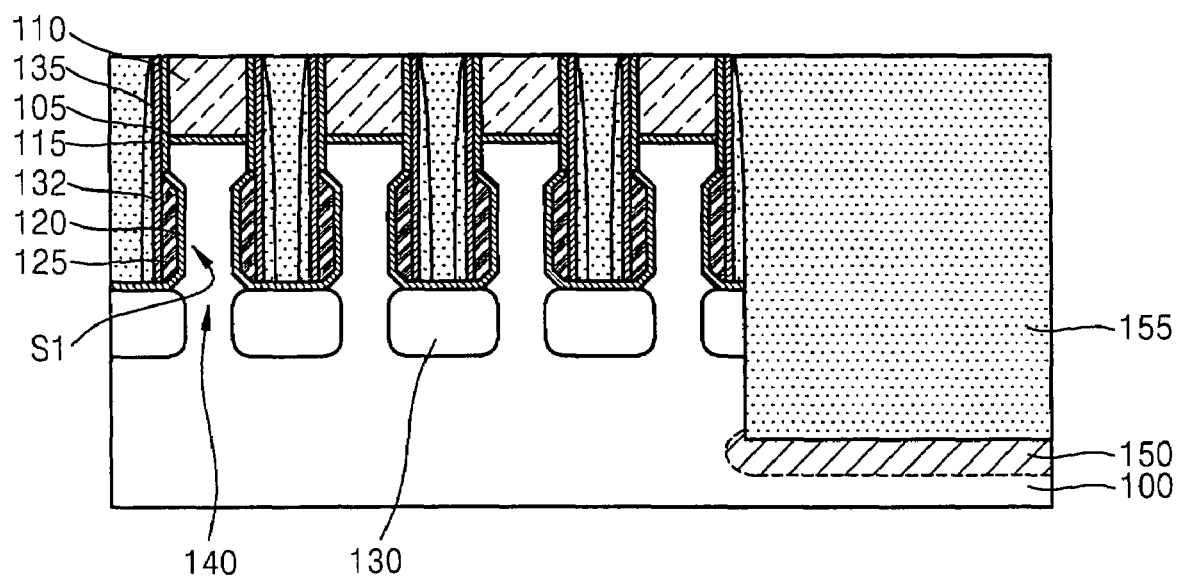
Figure 2C:
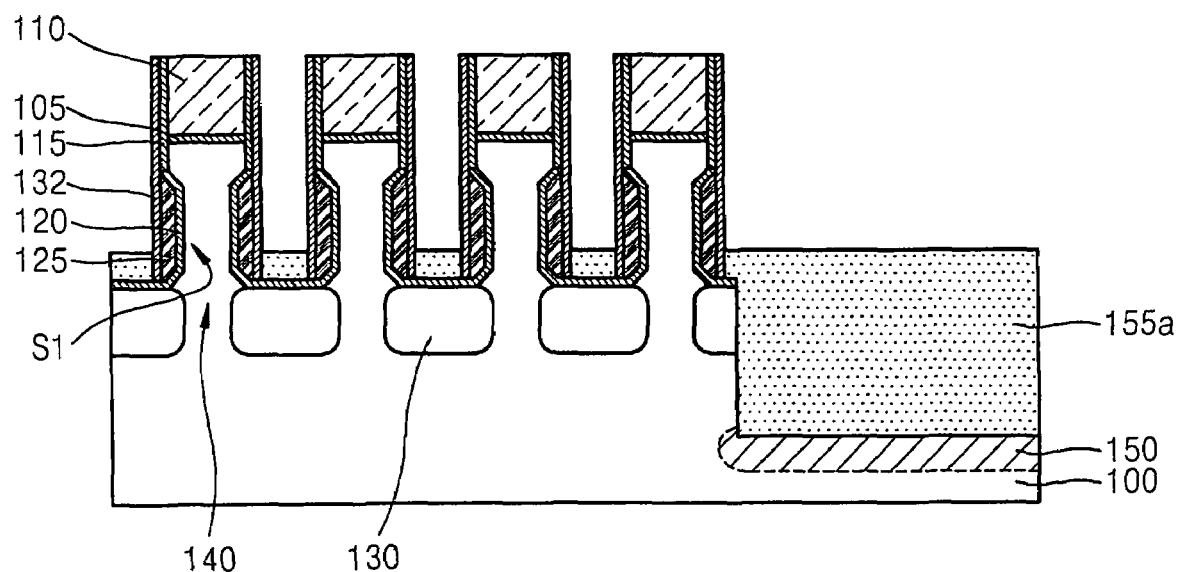
Figure 2D:
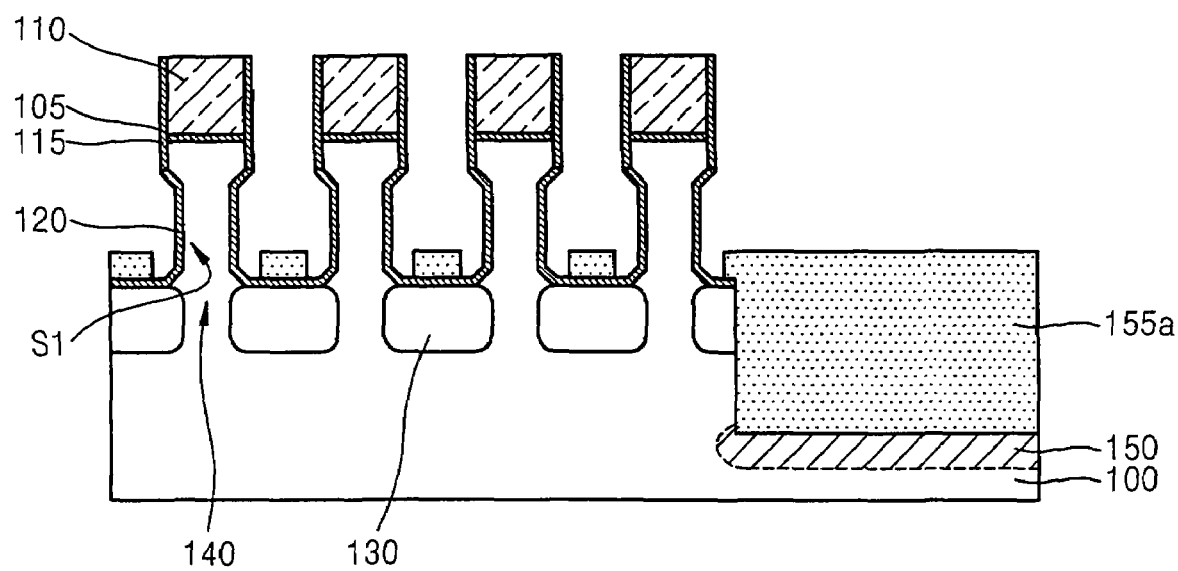
Figure 2E:
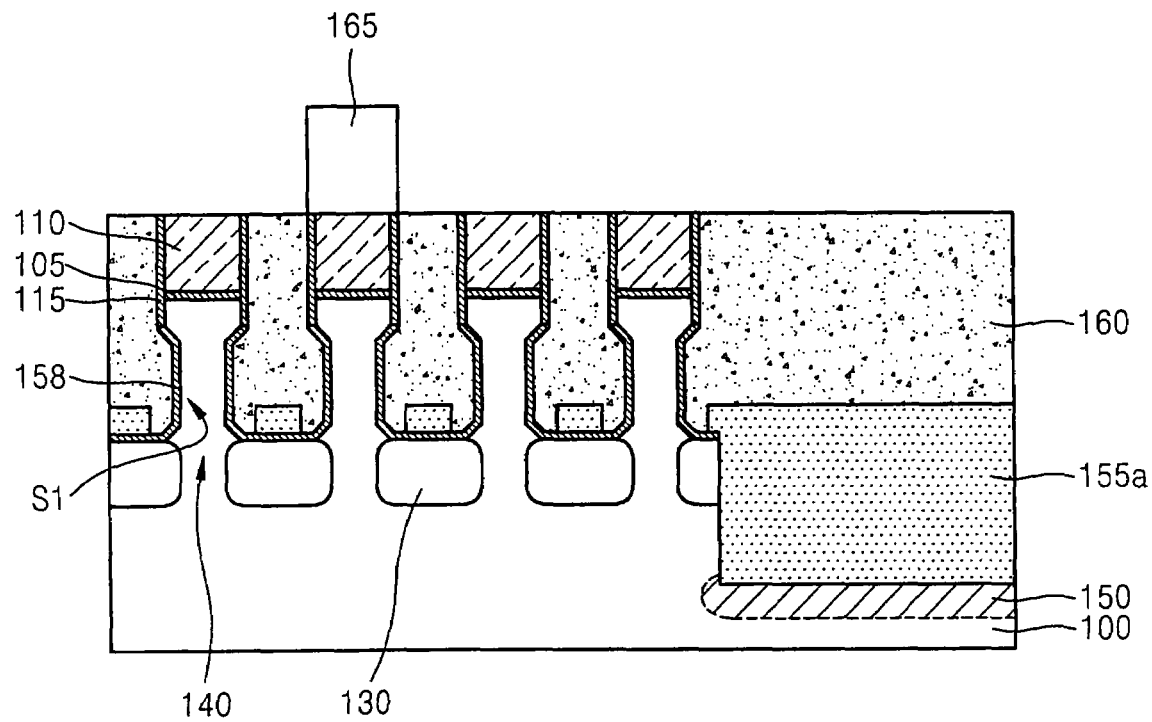
Figure 2F:
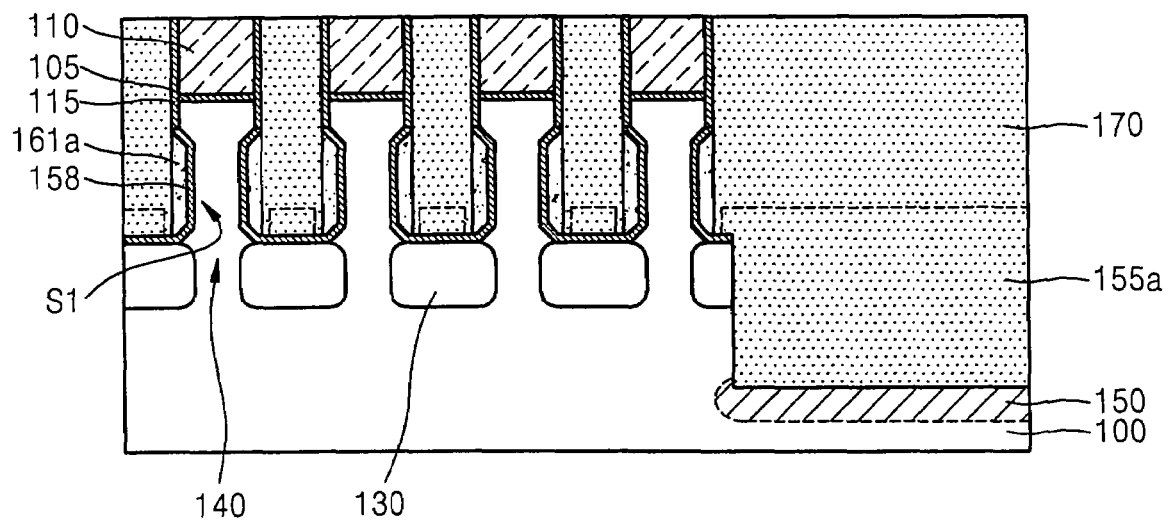
Figure 2G:
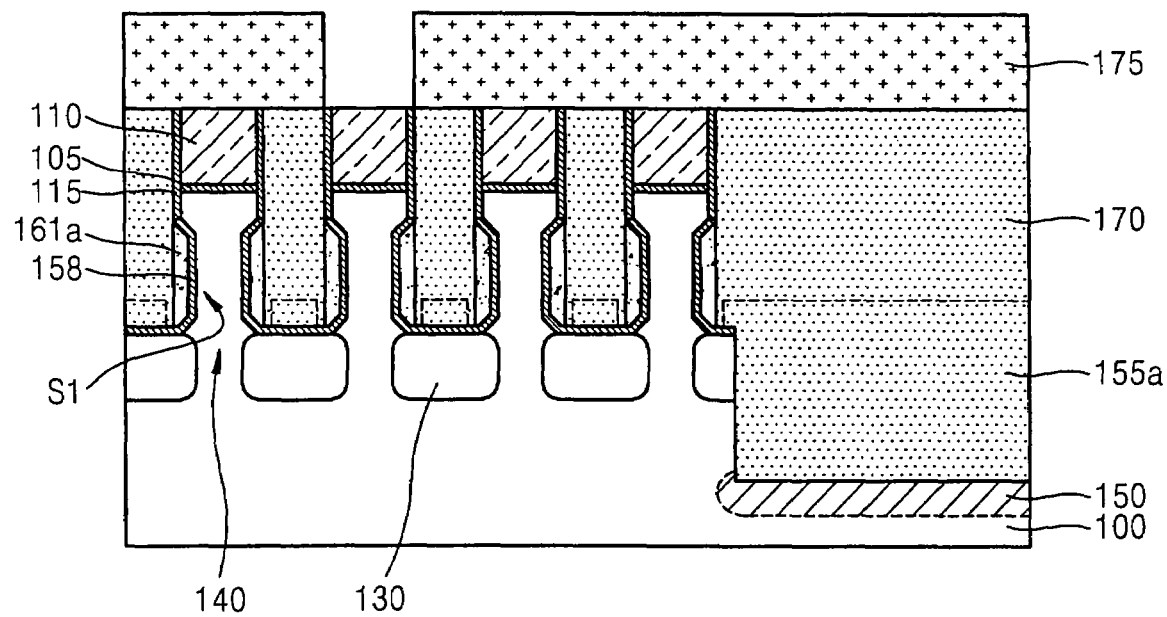
Figure 2H:
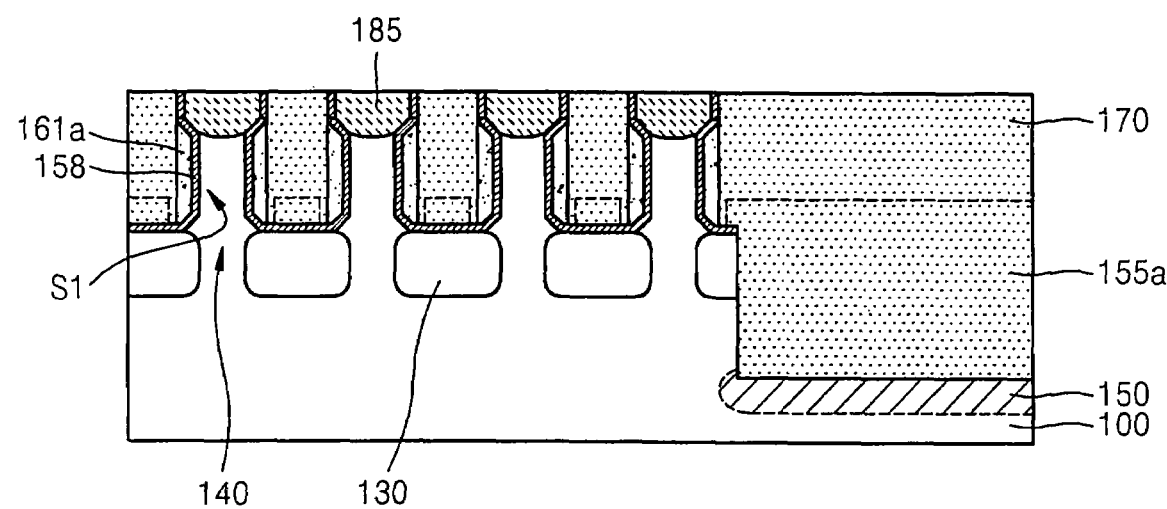
Figure 3A:
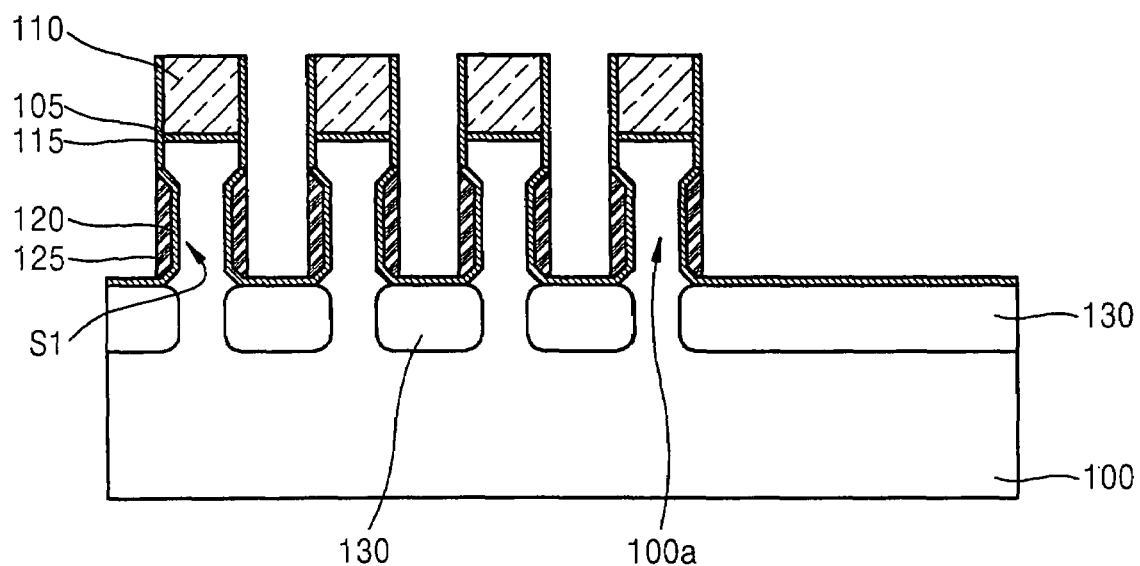
FIGS. 3A through 3H are cross-sectional views of the semiconductor device having the vertical channel according to an embodiment of the present invention taken along the lines y-y' of FIGS. 1A through 1G.
Figure 3B:
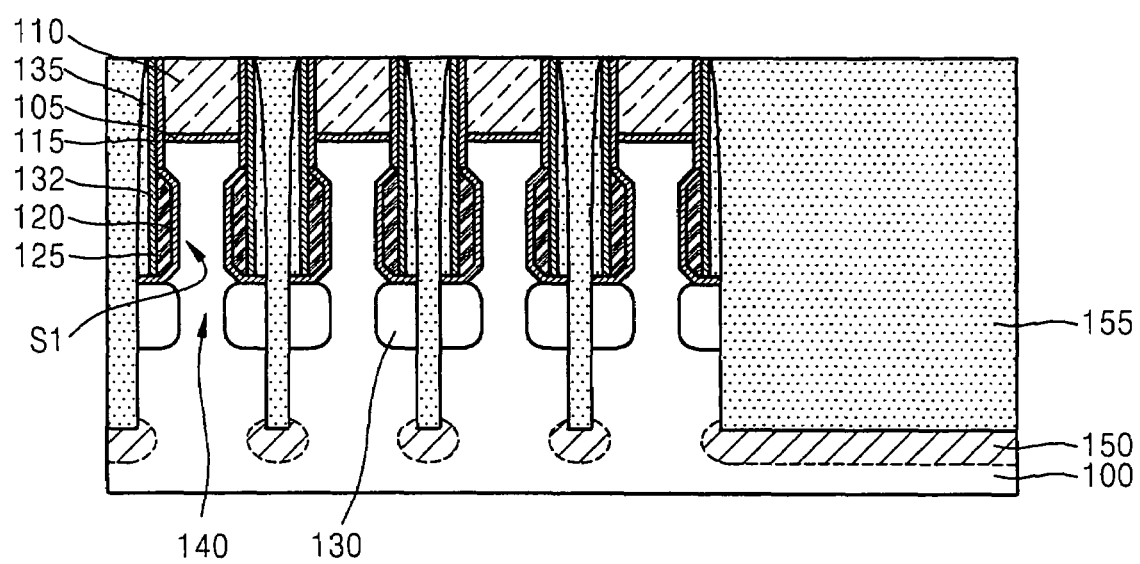
Figure 3C:
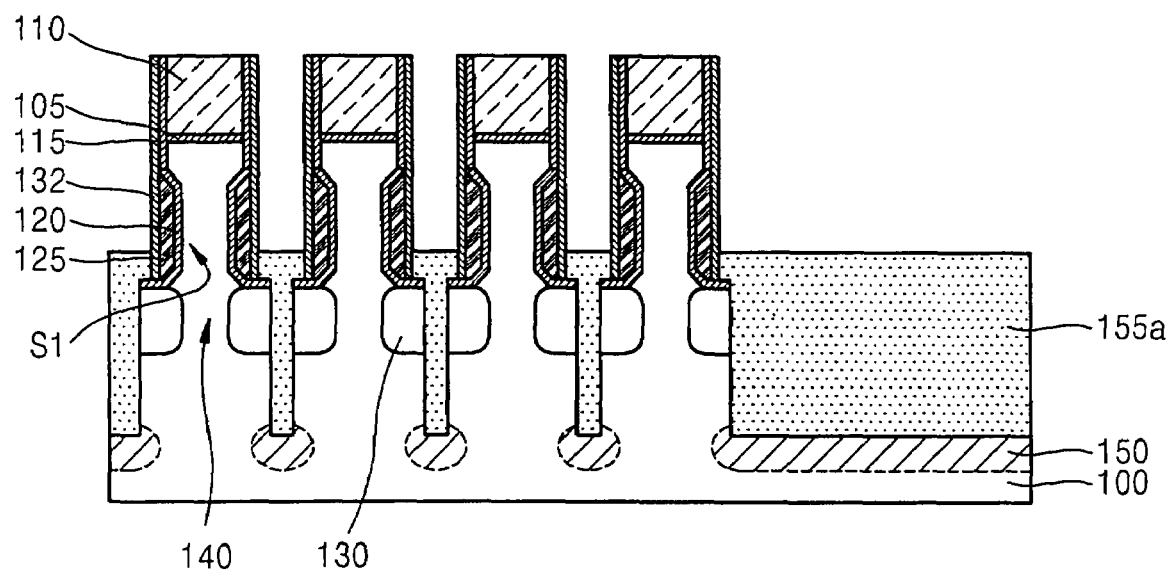
Figure 3D:
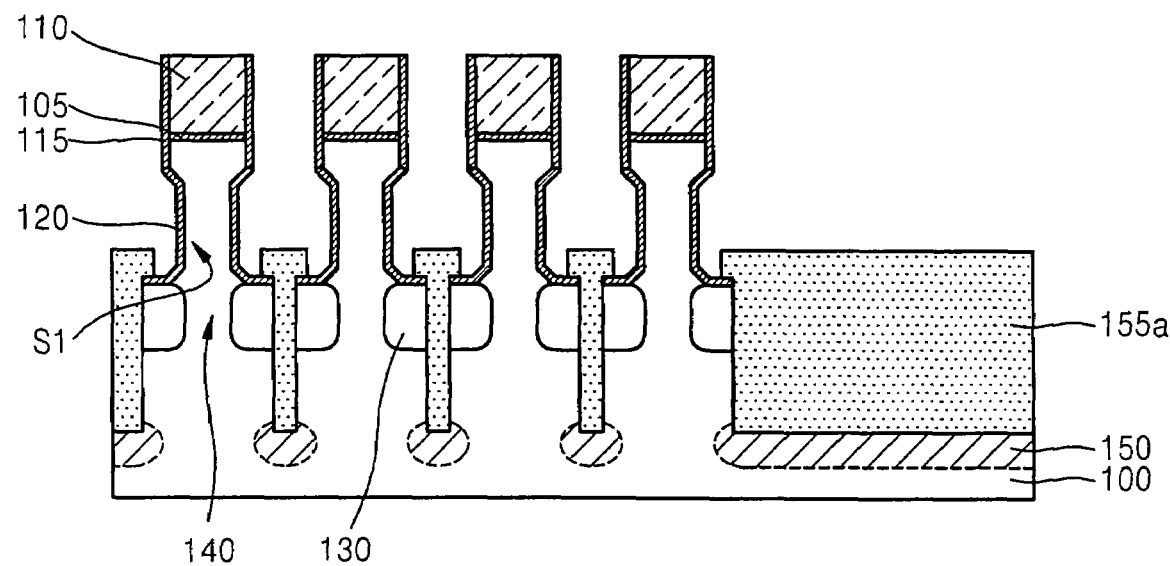
Figure 3E:
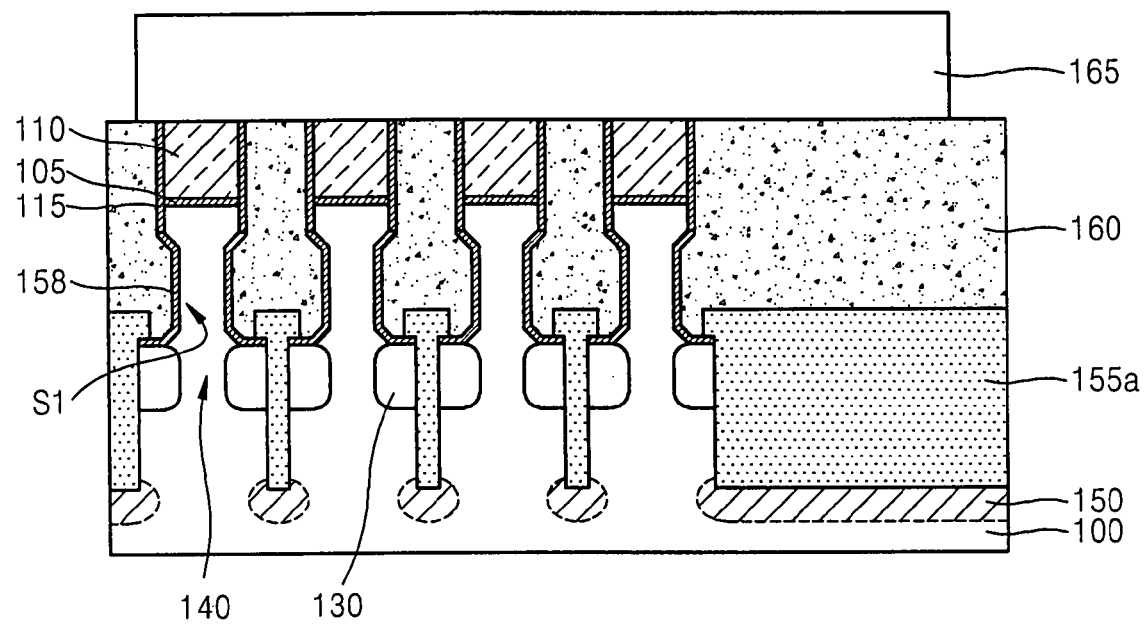
Figure 3F:
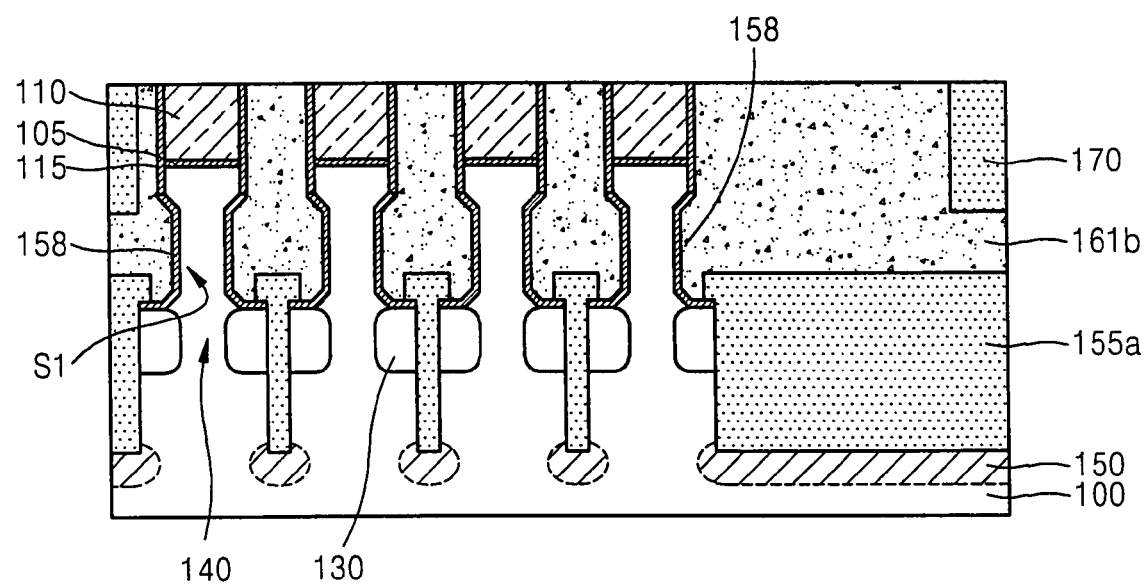
Figure 3G:
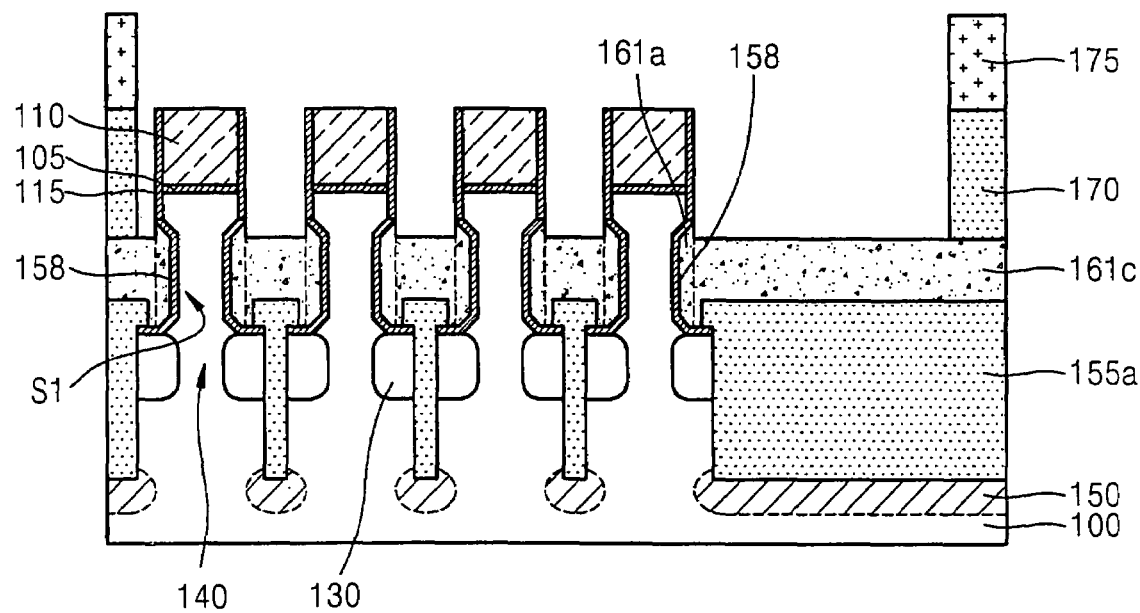
Figure 3H:
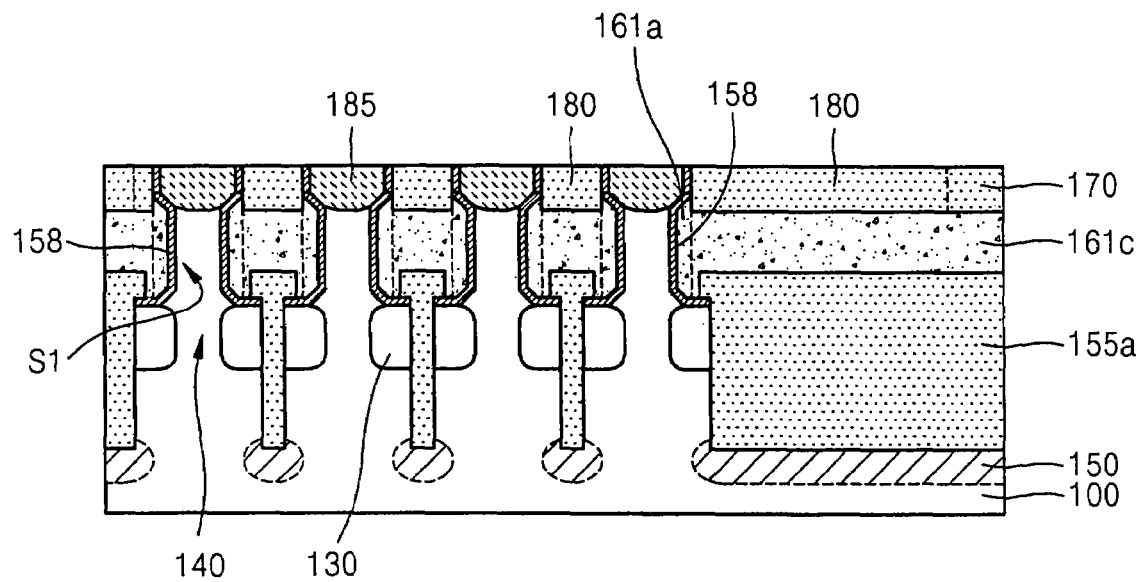
Figure 4D:
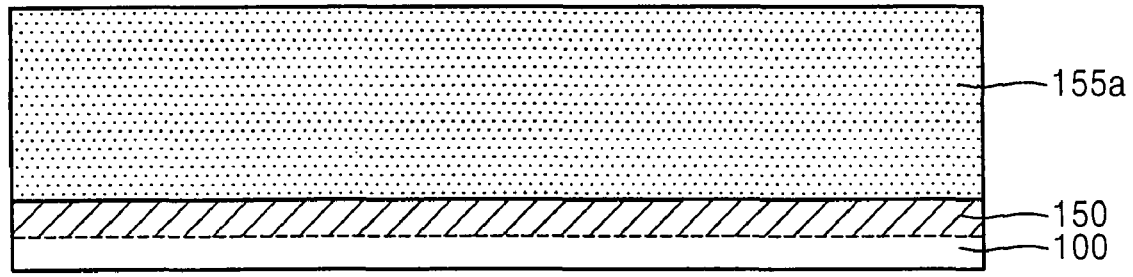
Figure 4E:
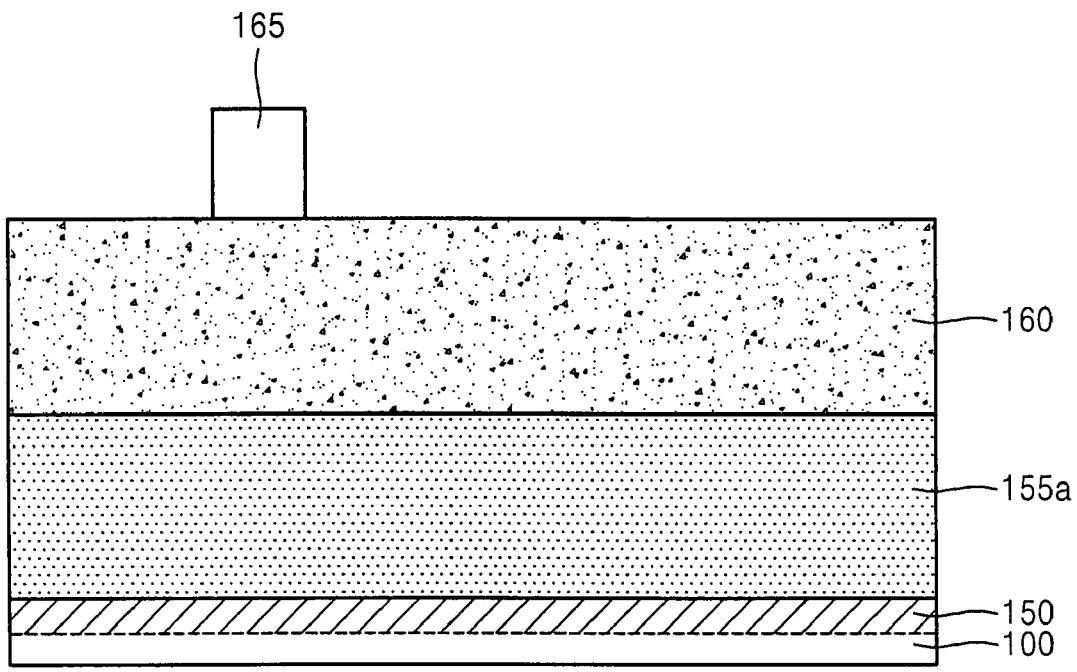
Figure 4F:
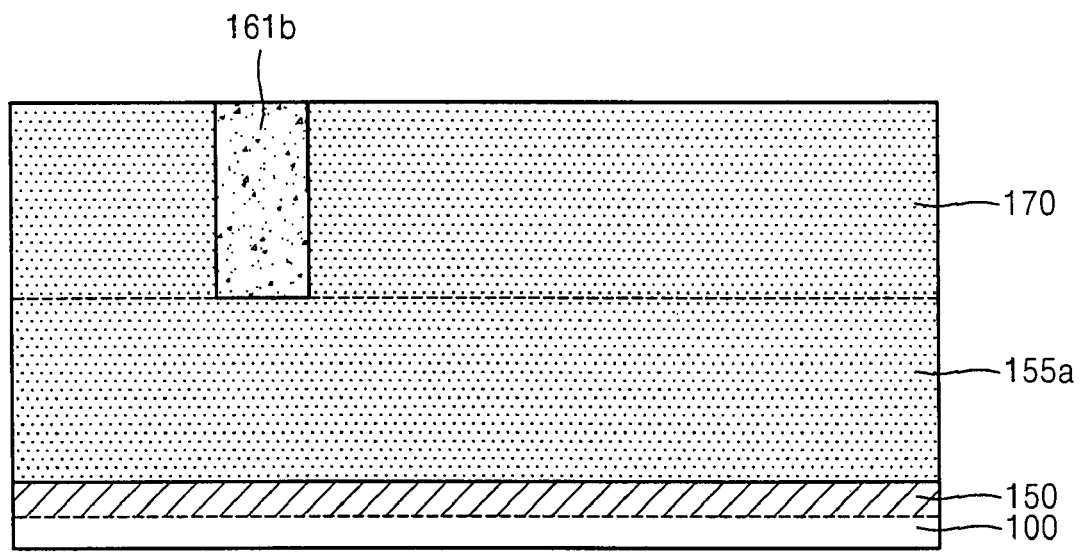
Figure 4G:
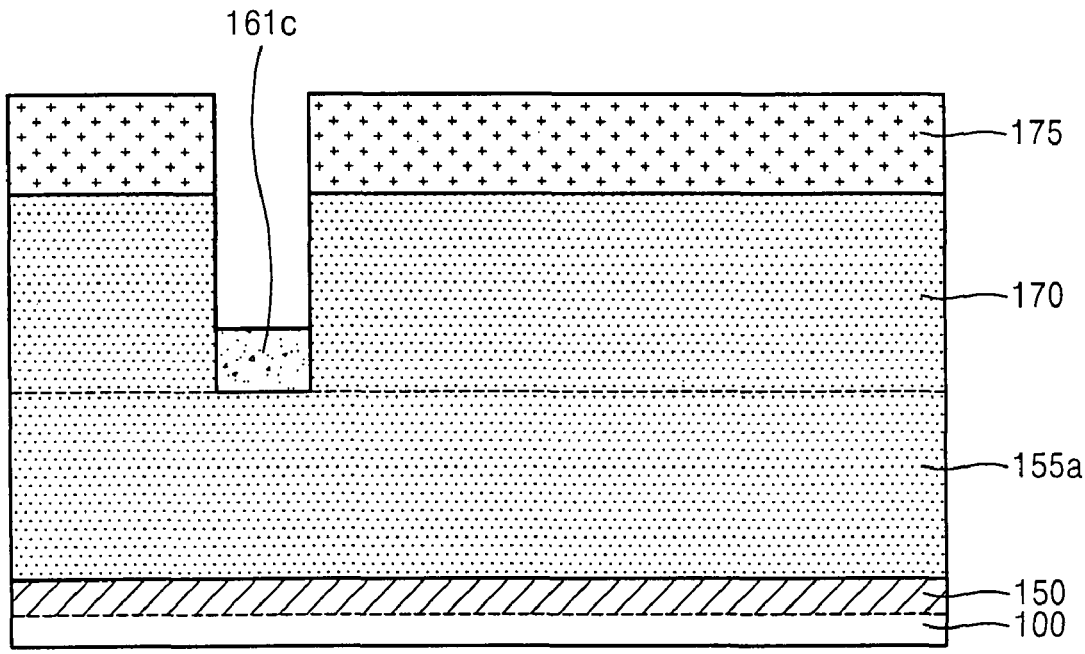
Figure 4H:
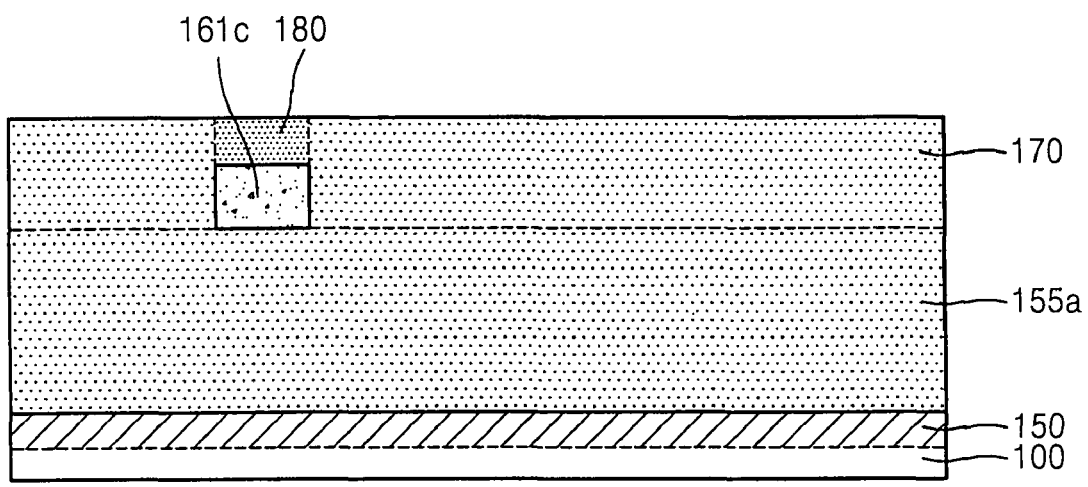

Referring to FIGS. 2D, 3D and 4D, capping layer 132 is removed sacrificial gate electrode 125 is exposed and selectively removed so that isotropic space S1 is again provided in active pillar 140. Bottom source/drain region 130 and embedded bit line 150 are shielded by first interlayer insulating layer 155a.

Referring to FIGS. 1D, 2E, 3E and 4E, the exposed sacrificial gate insulating layer 120 is removed and gate insulating layer 158 is formed by a deposition process or oxidation process using, for example, silicon oxide (SiO2) layer, a hafnium oxide (HfO2) layer, a tantalum oxide (Ta2O5) layer, an oxide/nitride (ON) layer, an oxide/nitride/oxide (ONO) layer, or the like. Word line material 160 is deposited such that it sufficiently fills isotropic space SI and the space between active pillars 140. Word line material 160 is planarized to expose the top surface of hard mask pattern 110. Word line material 160 may be formed as a polysilicon layer doped with n-type or p-type impurities, a transition metal layer, a transition metal silicide layer, or a multi-stacked layer including at least one additional layer above. Afterwards, first word line mask pattern 165 is formed on word line material 160 where the mask pattern 165 may be extended in a direction perpendicular to the embedded bit line 150, for example, in a row direction. First word line mask pattern 165 may be formed such that it shields at least one column of active pillars 140. First word line mask pattern 165 may be formed in every column in a memory device such as a DRAM. In addition, a photoresist layer or a hard mask layer may be used as word line mask pattern 165.

Referring to FIGS. 1E, 2F, 3F and 4F, word line material 160 is anisotropically etched using first word line mask pattern 165 and hard mask pattern 110 so that a ring-shaped gate electrode 161a and a preliminary word line 161b are formed. Herein, the ring-shaped gate electrode 161a is formed in isotropic space S1 of active pillar 140 and preliminary word line 161b is integrally formed with ring-shaped gate electrode 161a. That is, in the area that first word line mask pattern 165 does not exist, the word line material 160 is anisotropically etched corresponding to hard mask pattern 110 to form only ring-shaped gate electrode 161 surrounding active pillar 140. However, in the area where first word line mask pattern 165 exists, preliminary word line 161b is simultaneously formed with ring-shaped gate electrode 161a, wherein the preliminary word line 161b extends in the shape associated with first word line mask pattern 165. Ring-shaped gate electrode 161a and preliminary word line 161b are integrally formed from the same material. In this manner, no contact interface is present which significantly differs from the prior art. First word line mask pattern 165 is then removed and second interlayer insulating layer 170 is formed on the resultant structure of semiconductor substrate 100 on which the ring-shaped gate electrode 161a and the preliminary word line 161b are formed. Second interlayer insulating layer 170 is planarized such that the hard mask pattern 110 is exposed.

Referring to FIGS. 1F, 2G, 3G and 4G, a second word line mask pattern 175 is formed to expose the region where preliminary word line 161b has been formed. Second word line mask pattern 175 has a phase opposite to first word line mask pattern 165 so that it is formed using a reverse type photoresist while using only one reticle or mask. The exposed preliminary word line 161b is then etched to a predetermined thickness to form word line 161c. The top surface of word line 161c may be disposed on a plane lower than the top surface of active pillar 140. For example, top surface of word line 161c may be equal in height to or lower than the top surface of ring-shaped gate electrode 161a. As described above, since the gate electrode 161a and word line 161c are formed through a single process using the same material, no interface exists between the gate electrode 161a and word line 161c, thereby the contact resistance is reduced.

Referring to FIGS. 1G, 2H, 3H and 4H, second word line mask pattern 175 is removed by a well-known process and third interlayer insulating layer 180 is formed over exposed word line 161c. After removing hard mask pattern 110, impurities are implanted into the top surface of active pillar 140 to form a top source/drain region 185 and complete a MOS transistor having a vertical channel. Third interlayer insulating layer 180 is then planarized. After forming the gate electrode 125, the bottom source/drain region 130 and the embedded bit line 150 by a self-aligning scheme, sacrificial gate electrode 125 is removed. Ring-shaped gate electrode 161a and word line 161c connecting ring-shaped electrodes 161a are simultaneously formed in the region where sacrificial gate electrode 125 is removed. Accordingly, it is possible to reduce the contact resistance because the contact interface does not exist between the gate electrode 161a and the word line 161c.

Alternatively, ring-shaped gate electrode 161a and word line 161c may be integrally formed without using sacrificial gate electrode 125 in an embodiment in accordance with the present invention.

Figure 5A:
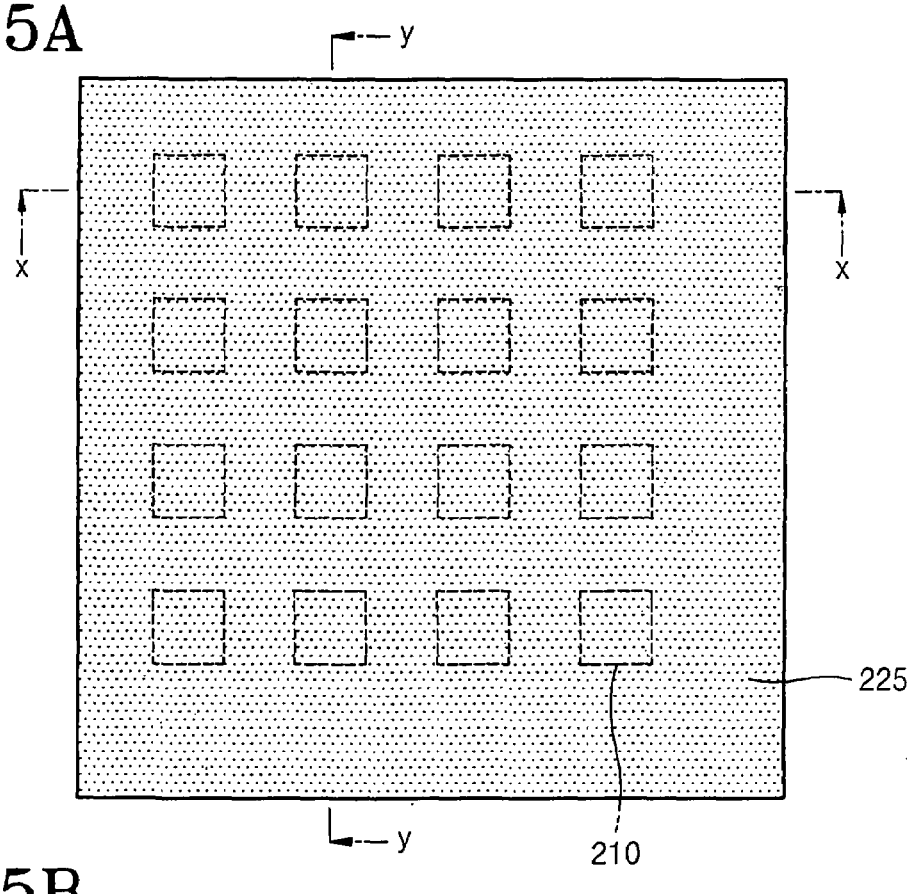
FIGS. 5A through 5E are plan views of a semiconductor device having a vertical channel according to another embodiment of the present invention.
Figure 6A:
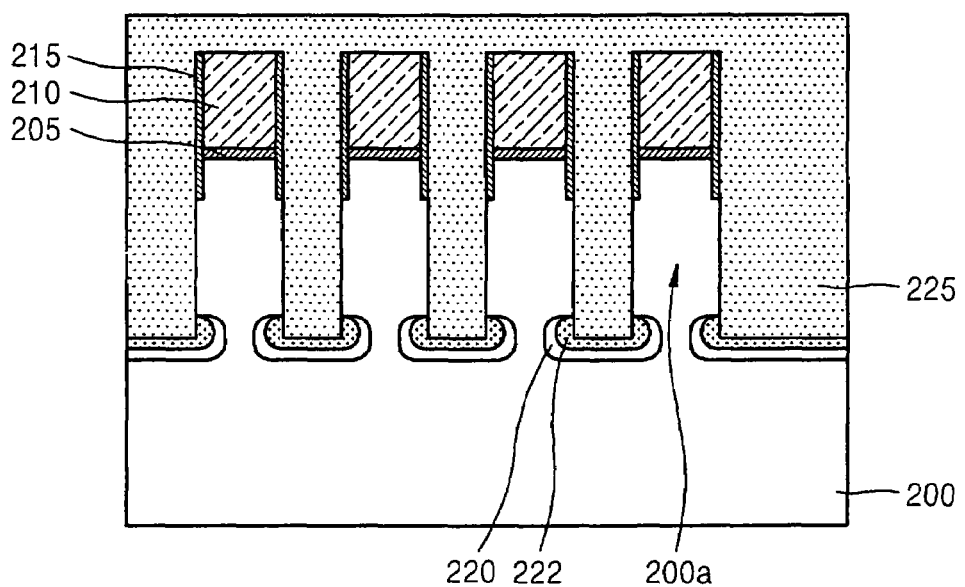
FIGS. 6A through 6E are cross-sectional views of the semiconductor device having the vertical channel according to another embodiment of the present invention taken along lines x-x' of FIGS. 5A through 5E.
Figure 7A:
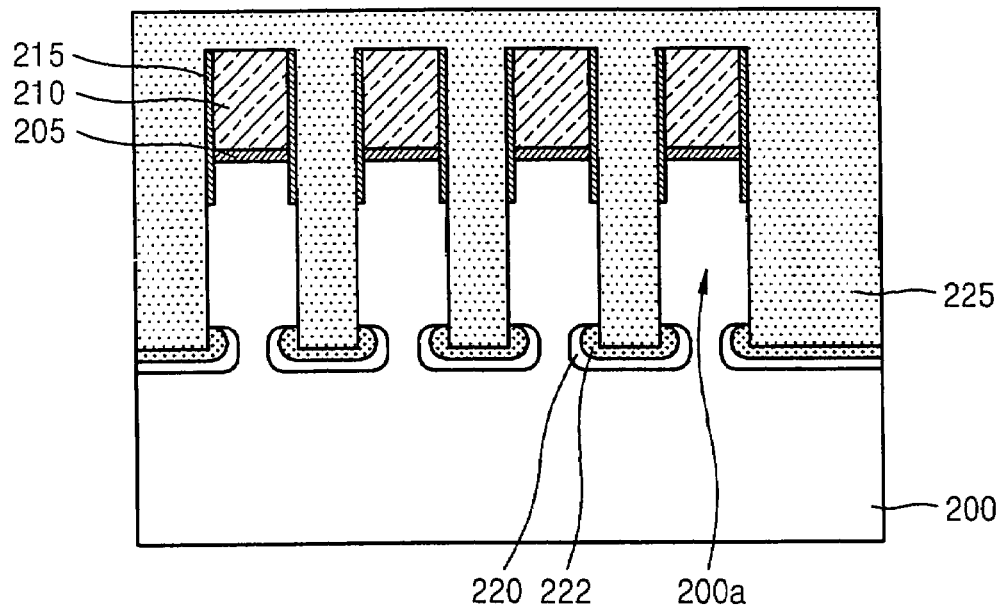
FIGS. 7A through 7E are cross-sectional views of the semiconductor device having the vertical channel according to another embodiment of the present invention taken along lines y-y' of FIGS. 5A through 5E.

Referring to FIGS. 5A, 6A, and 7A, the manufacturing processes are the same as those of the aforementioned embodiment with the exception of the formation of upper pillar 200a. These FIGS illustrate semiconductor substrate 200, pad oxide layer 205, hard mask layer 210 and first insulating spacer 215. After forming a bottom source/drain region 220 in semiconductor substrate 200 between the upper pillars 200a, signal line 222 is selectively formed on the bottom source/drain region 220. Signal line 222 is a conductive layer that becomes a bit line using a predetermined patterning process to form a conductive layer such as a silicide layer on the bottom source/drain region 220. First interlayer insulating layer 225 is formed over the resultant structure such that it sufficiently fills the space between upper pillars 200a.

Figure 5B:
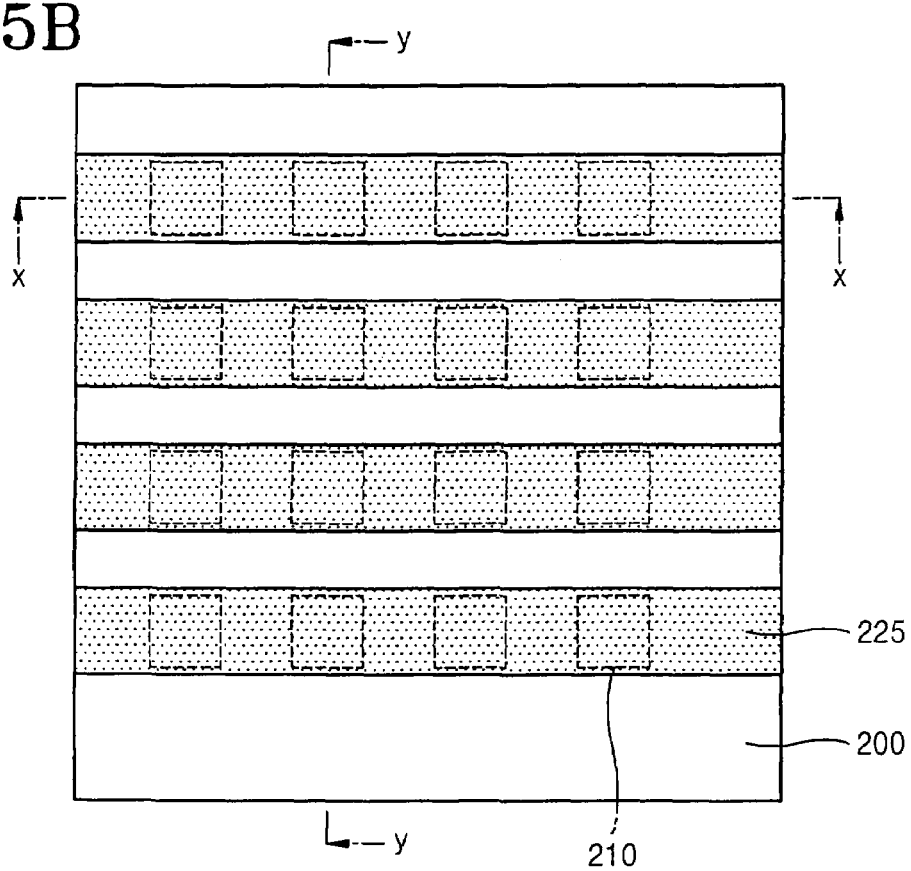
Figure 6B:
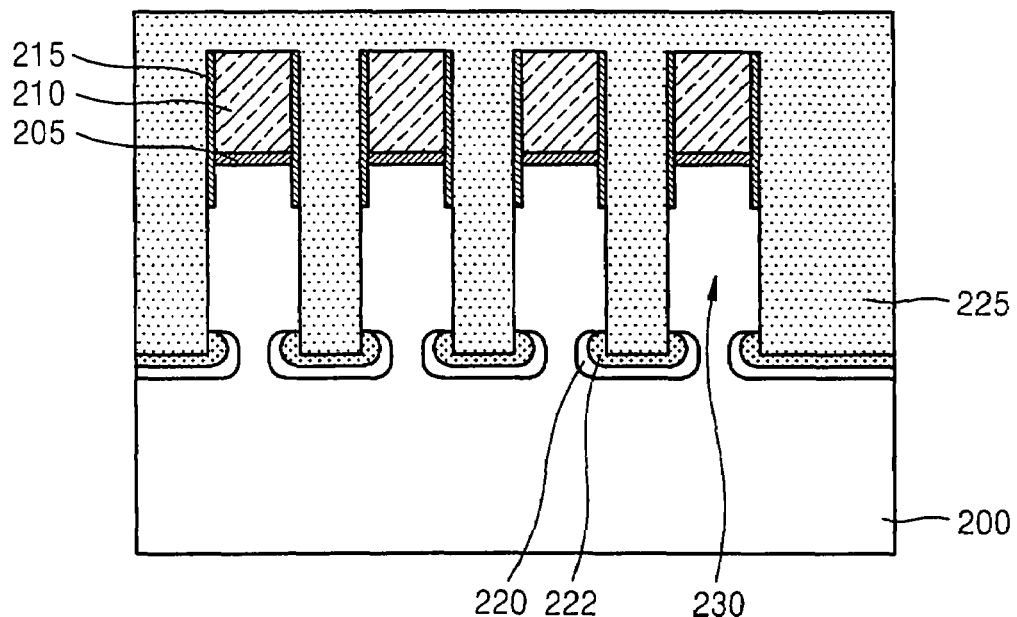
Figure 7B:
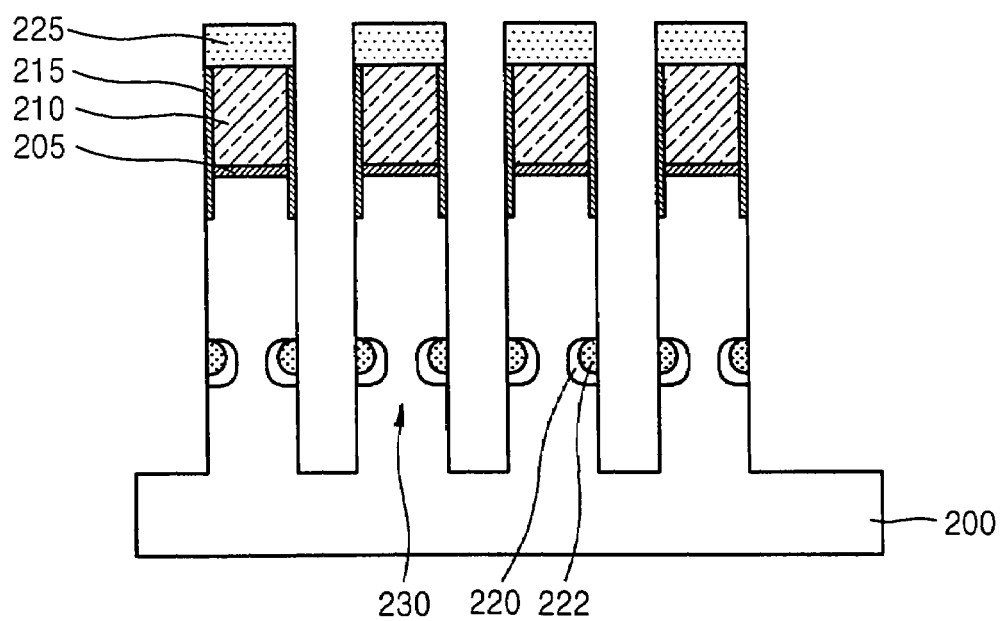

Referring to FIGS. 5B, 6B, and 7B, a bit line mask pattern (not shown) is formed on first interlayer insulating layer 225 by well-known photolithography processes. The bit line mask pattern is formed in each row to cover all the hard mask patterns 210 disposed in the same row, e.g., in direction x-x'. The semiconductor substrate 200 incorporating first interlayer insulating layer 225 and the bottom source/drain region 220 is etched corresponding to the bit line mask pattern to define active pillar 230 and bit line 222. Thus, active pillars 230 disposed in different rows are electrically isolated from one another. The bit line mask pattern is then removed by a well-known process.

Figure 5C:
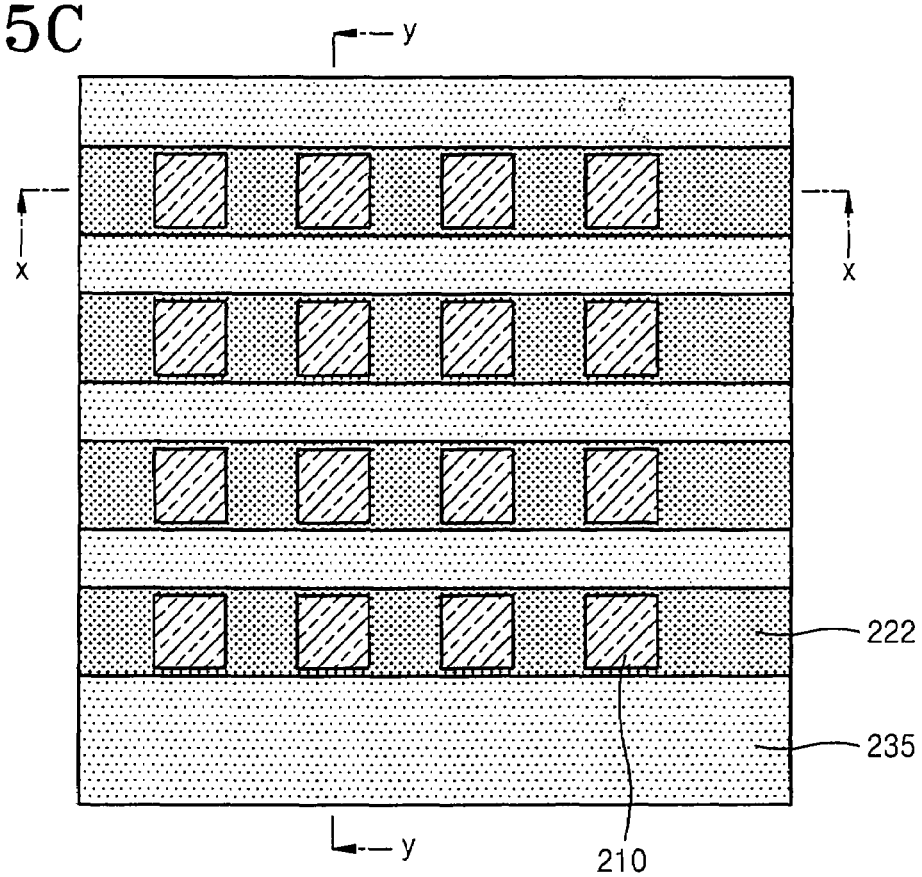
Figure 6C:
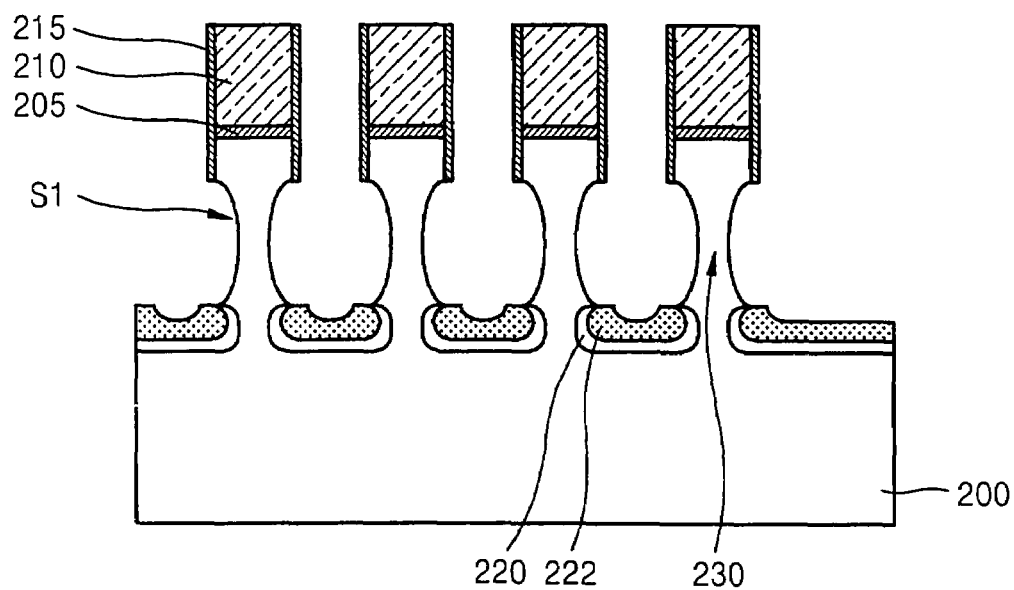
Figure 7C:
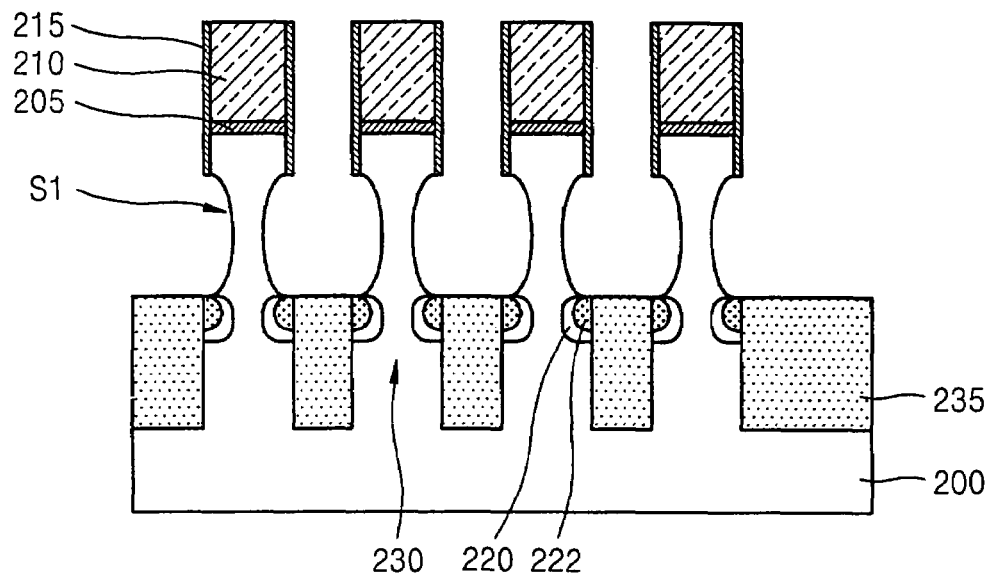

Referring now to FIGS. 5C, 6C, and 7C, second interlayer insulating layer 235 is formed on semiconductor substrate 200 such that it sufficiently fills the space between active pillars 230. Second interlayer insulating layer 235 is etched back to expose bottom source/drain region 220. Second interlayer insulating layer 235 shown in FIG. 7C taken along the line y-y' of FIG. 5C is buried between active pillars 230. Sidewall of exposed active pillar 230 is isotropically etched to a predetermined thickness using hard mask pattern 210 and first insulating spacer 215 to form an isotropic space S1.

Figure 5D:
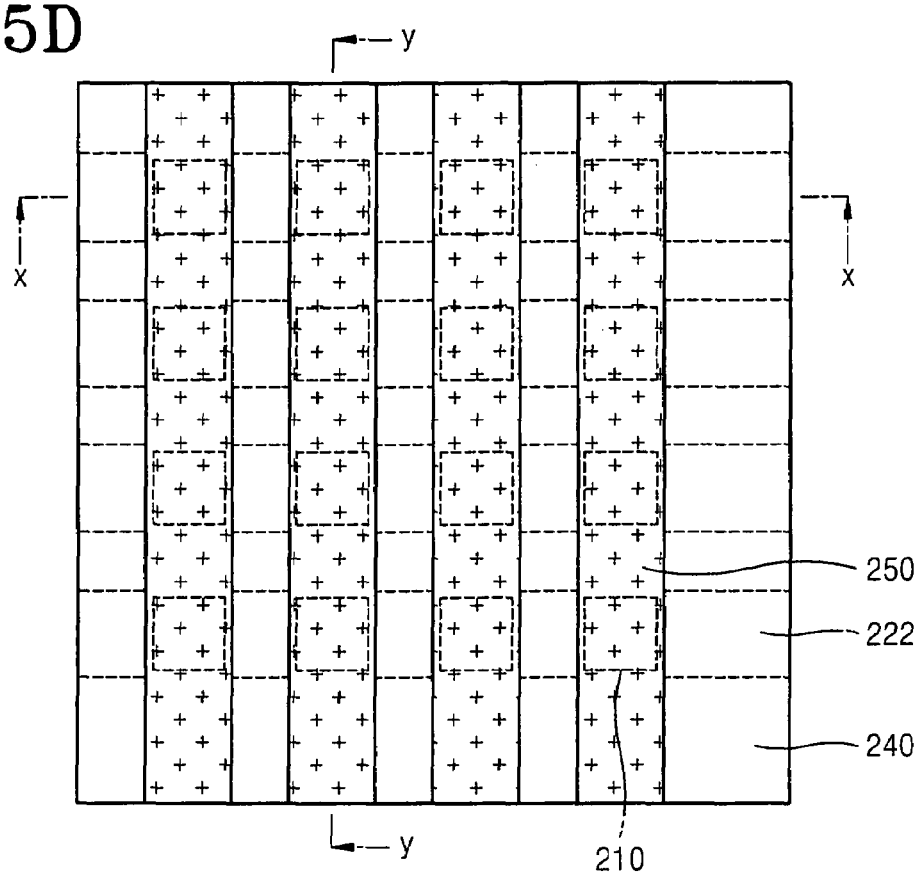
Figure 6D:
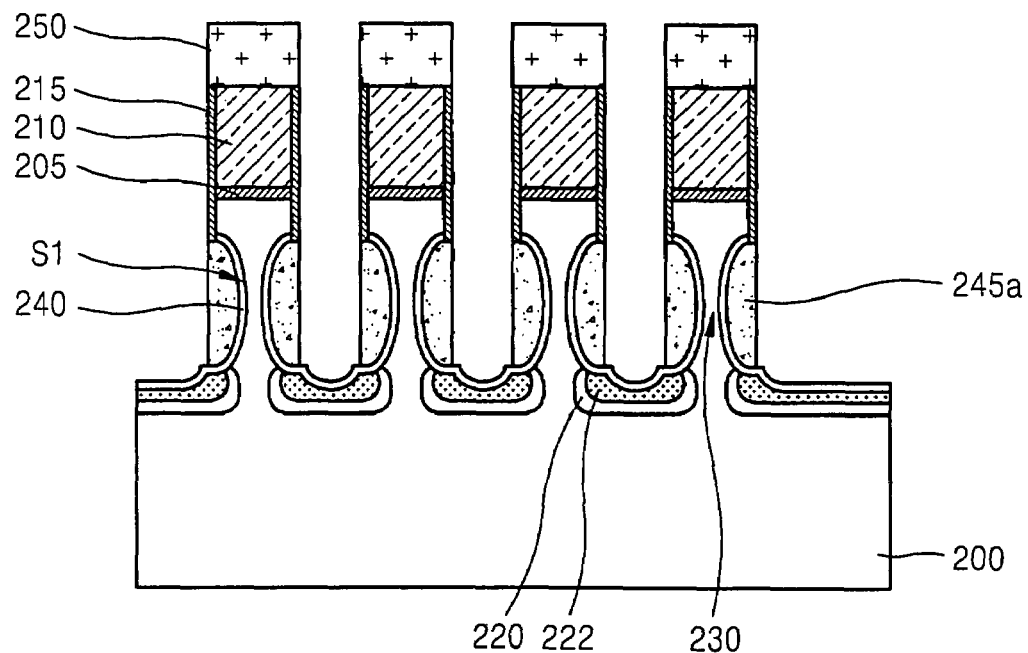
Figure 7D:
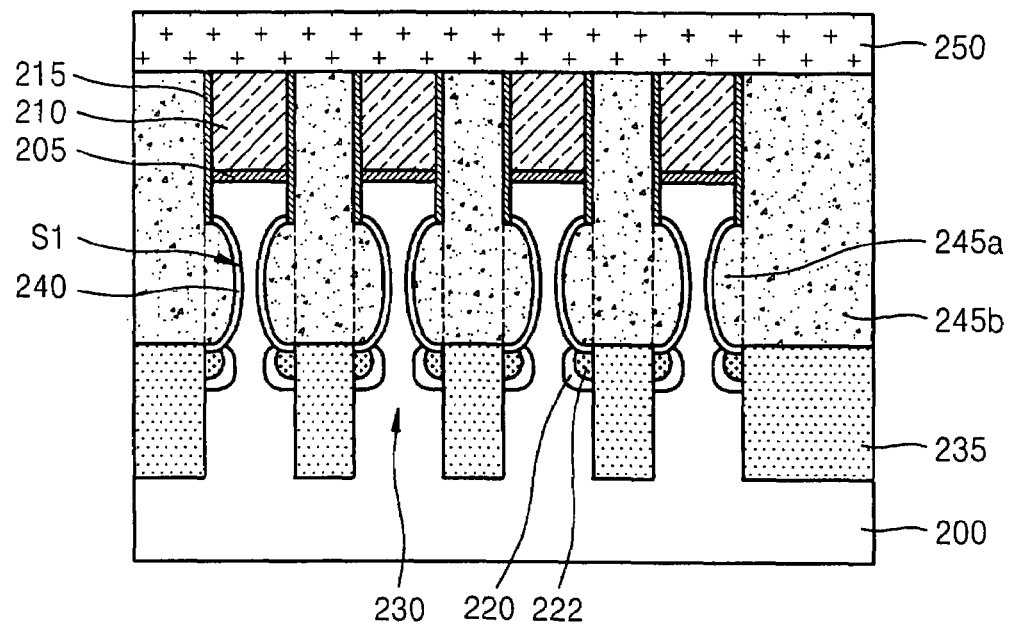

Referring to FIGS. 5D, 6D, and 7D, gate oxide layer 240 is deposited on the exposed surface of semiconductor substrate 200, i.e., the surface of active pillar 230 and the surface of the bottom source/drain region 220 incorporating bit line 222. A word line material is then formed over the resultant structure which sufficiently fills isotropic space S1 and the space between active pillars 230. The word line material may be formed of a polysilicon layer, a transition metal layer, a transition metal nitride layer, a transition metal silicide layer, or a multi-stacked layer including at least one additional layer above. The word line material is planarized such that it becomes as high as hard mask pattern 210. A word line mask pattern 250 is then formed on the word line material for simultaneously defining a word line and a gate electrode. Word line mask pattern 250 is formed perpendicular to bit line 222 and covers hard mask patterns 210 arranged in the same column. Although the word line mask pattern 250 is formed in every column in an alternative embodiment, the word line mask pattern 250 may be formed in a selected column similar to the embodiment referenced above. A photoresist layer or a hard mask layer may be used as word line mask pattern 250. The word line material is anisotropically etched corresponding to word line mask pattern 250 to define a ring-shaped gate electrode 245a and a preliminary word line 245b. The ring-shaped gate electrode 245a is buried in isotropic space S1 of active pillar 230 and the preliminary word line 245b crosses over bit line 222.

Figure 5E:
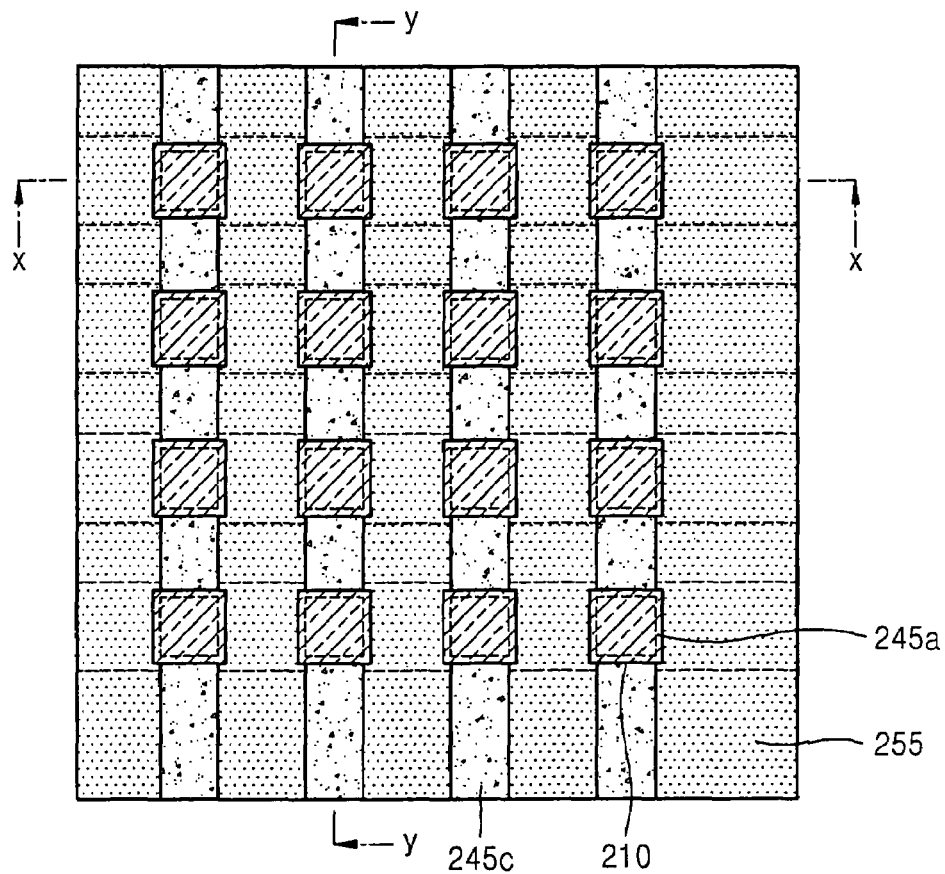
Figure 6E:
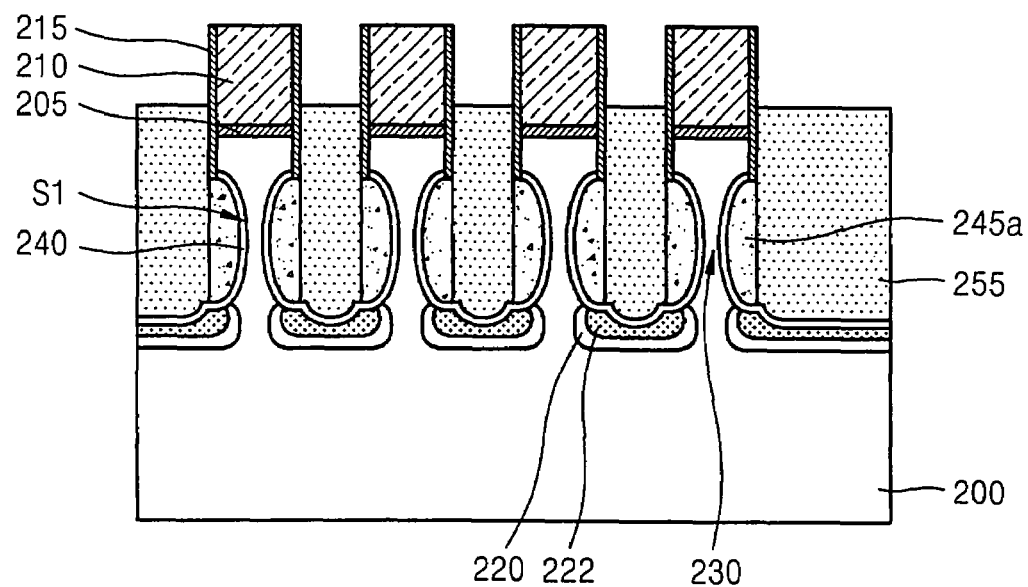
Figure 7E:
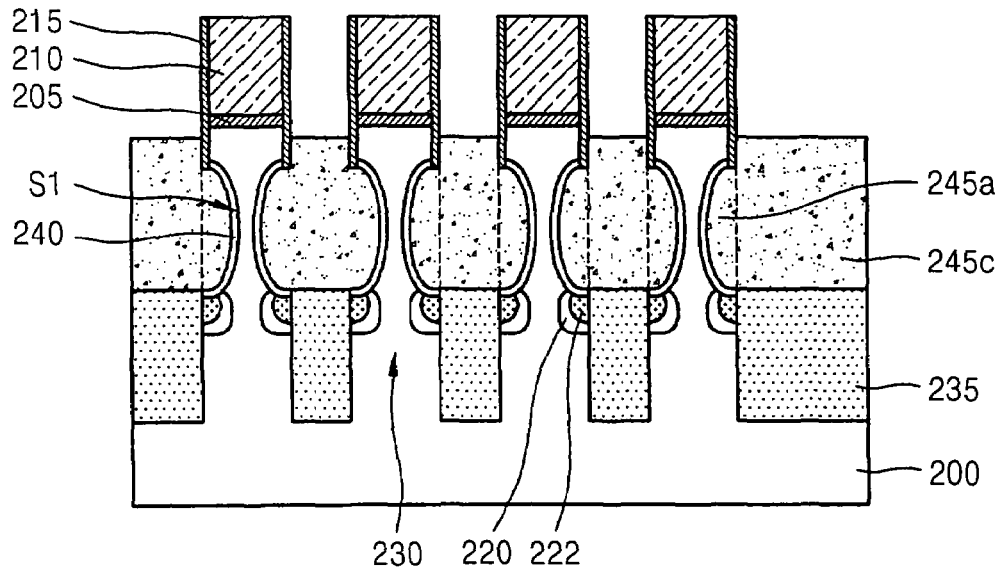

Referring to FIGS. 5E, 6E, and 7E, word line mask pattern 250 is removed and preliminary word line 245b is etched back to a predetermined thickness so that preliminary word line 245b becomes as high as ring-shaped gate electrode 245a, thereby forming word line 245c. Word line 245c is integrally formed with ring-shaped gate electrode 245a similar to the previous embodiment. In this manner, no contact interface is present between gate electrode 245a and word line 245c. Thus, it is possible to reduce the contact resistance caused by the contact interface. A third interlayer insulating layer 255 is formed over the resultant structure of the semiconductor substrate 200 such that adjacent active pillars 230 are electrically isolated from each other. Removing of the hard mask pattern and forming of a top source/drain region on the exposed active pillar 230 are performed so as to complete a semiconductor device having a vertical channel. However, these steps have been described in detail above and will not be described in connection with the present embodiment.

Figure 8A:
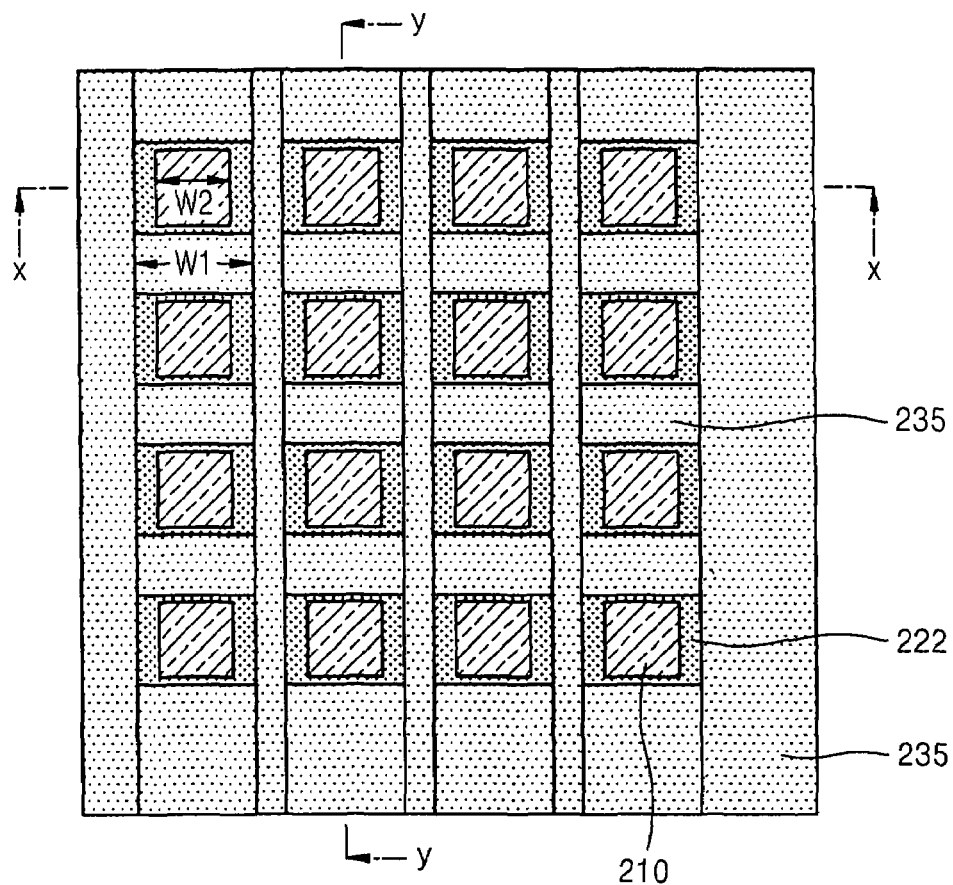
FIGS. 8A and 8B are plan views of a semiconductor device having a vertical channel using damascene process according to another embodiment of the present invention.
Figure 8B:
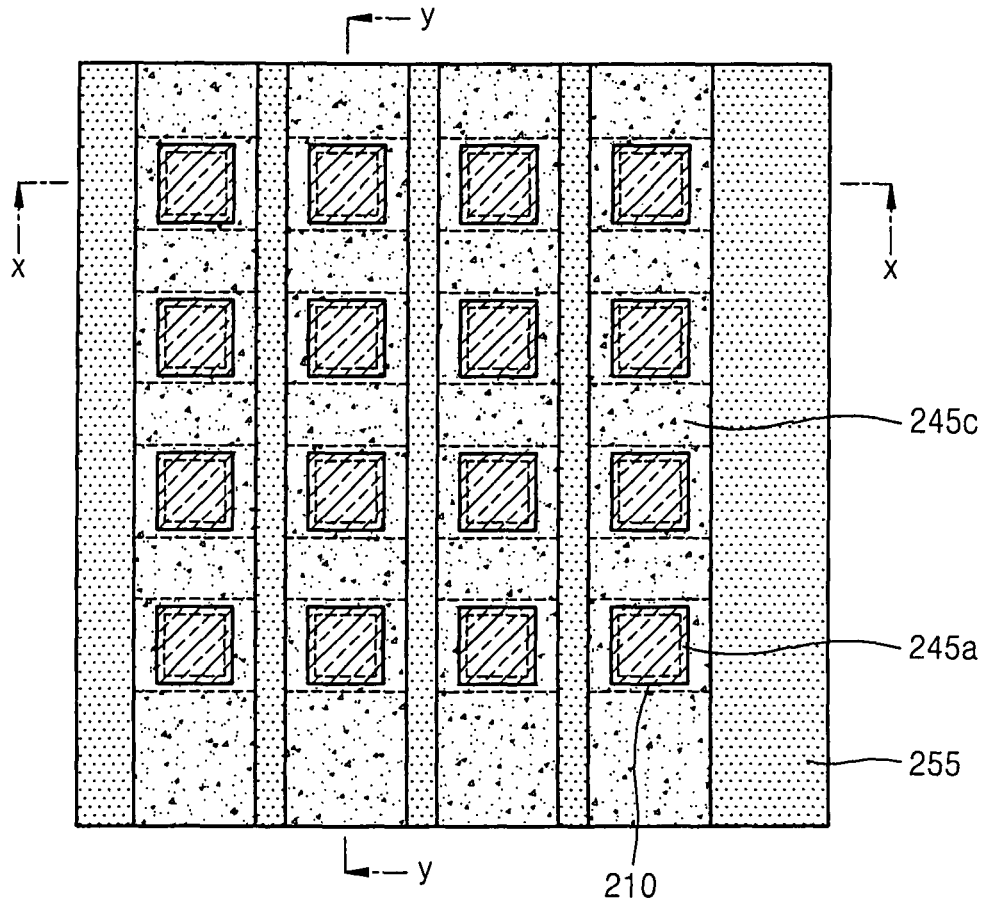
Figure 9A:
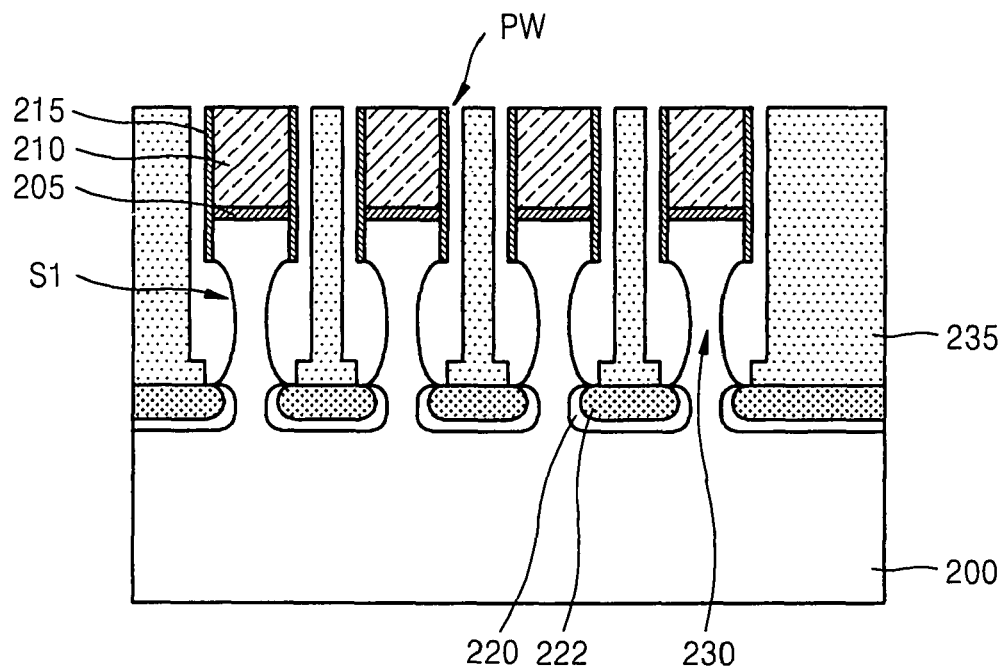
FIGS. 9A through 9C are cross-sectional views of the semiconductor device having the vertical channel using damascene process according to another embodiment of the present invention taken along lines x-x' of FIGS. 8A and 8B.
Figure 9B:
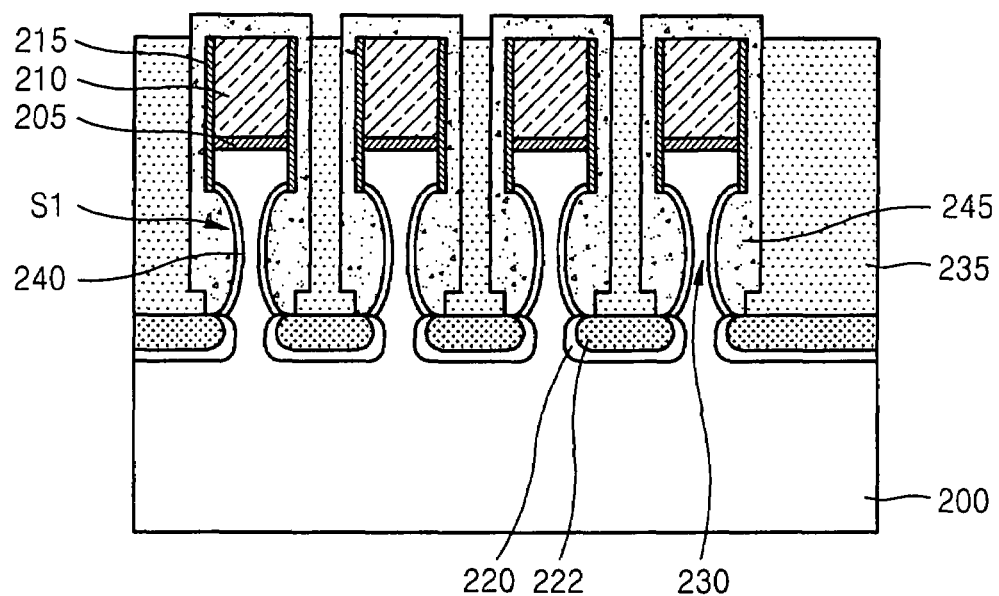
Figure 9C:
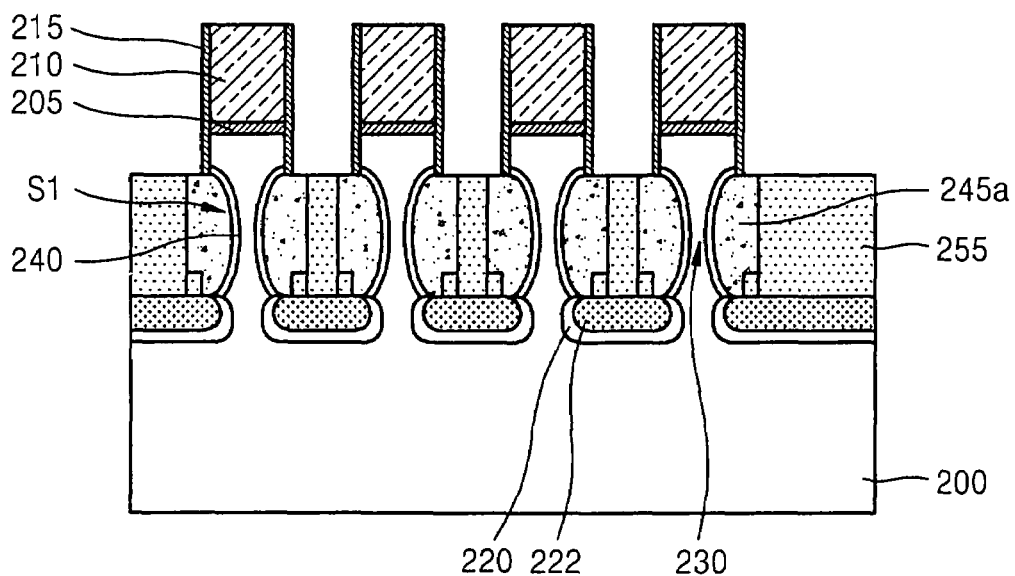
Figure 10A:
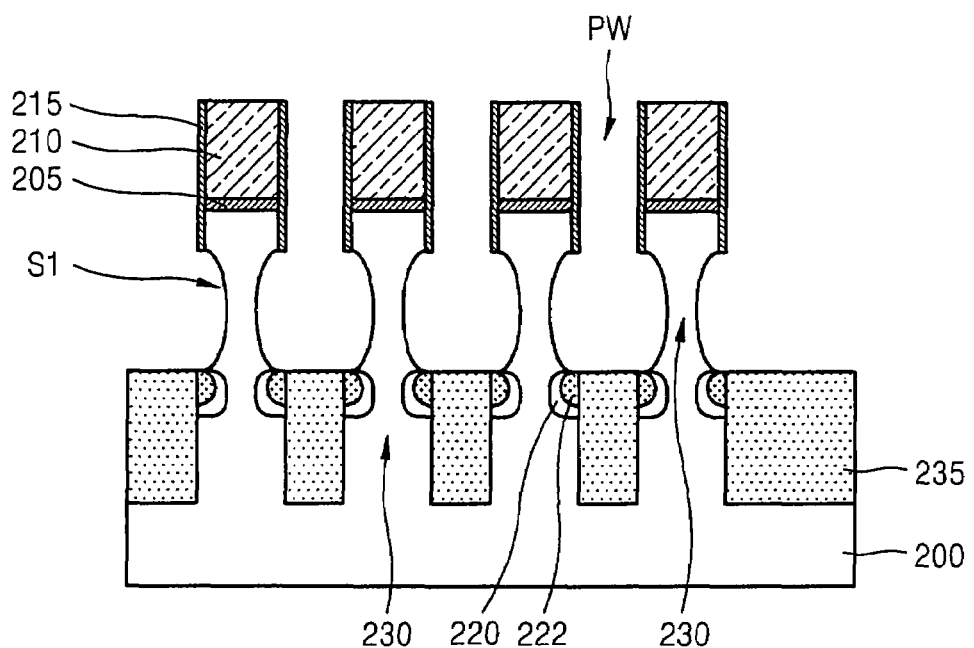
FIGS. 10A through 10C are cross-sectional views of the semiconductor device having the vertical channel using damascene process according to another embodiment of the present invention taken along lines y-y' of FIGS. 8A and 8B.

Ring-shaped gate electrode 245a and word line 245c may be formed by a damascene process. FIGS. 8A and 8B are plan views of a semiconductor device having a vertical channel using a damascene process. FIGS. 9A through 9C are cross-sectional views taken along the lines x-x' of FIGS. 8A and 8B, and FIGS. 10A through 10C are cross-sectional views taken along the lines y-y' of FIGS. 8A and 8B. Further, processes prior to a process illustrated in FIGS. 8A, 9A and 10A are identical to the processes illustrated in FIGS. 5A, 6A and 7A and FIGS. 5B, 6B and 7B and therefore, further descriptions have been omitted.

Referring to FIGS. 8A, 9A and 10A, second interlayer insulating layer 235 is deposited on semiconductor substrate 200 having an active pillar 230 so that the insulating layer fills the space between active pillars 230. Second interlayer insulating layer 235 is planarized to expose hard mask pattern 210. A damascene mask pattern (not shown) is formed on second interlayer insulating layer 235 to expose a predetermined region for a word line. The damascene mask pattern crosses over bit line 222 and exposes hard mask patterns 210 disposed in the same column. In addition, a width (W1) of the exposed portion by the damascene mask pattern may be greater than the width (W2) of the hard mask pattern 210 so that the sidewall of active pillar 230 can be exposed. Afterwards, second interlayer insulating layer 235 is anisotropically etched to a predetermined thickness corresponding to the shape of the damascene mask pattern. Second interlayer insulating layer 235 may be etched so that a predetermined thickness still remains on bit line 222, as illustrated in FIG. 9A taken along line x-x' of FIG. 8A. The damascene mask pattern is then removed by a well-known process. Sidewall of active pillar 230 is isotropically etched using hard mask pattern 210 and first insulating spacer 215 as a mask to form isotropic space S1 on the sidewall of active pillar 230. As a result, a predetermined region PW for a word line is formed in second interlayer insulating layer 235.

Figure 10B:
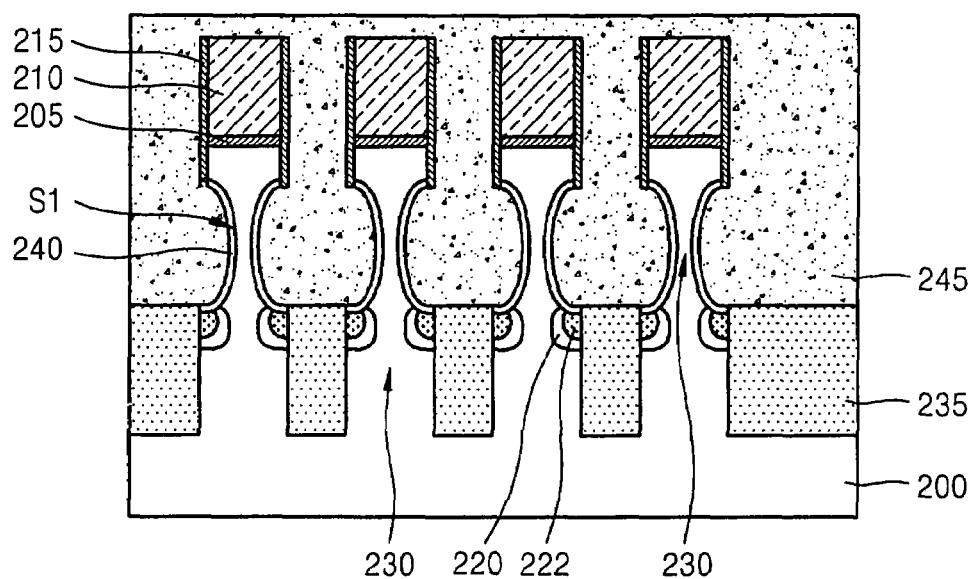
Figure 10C:
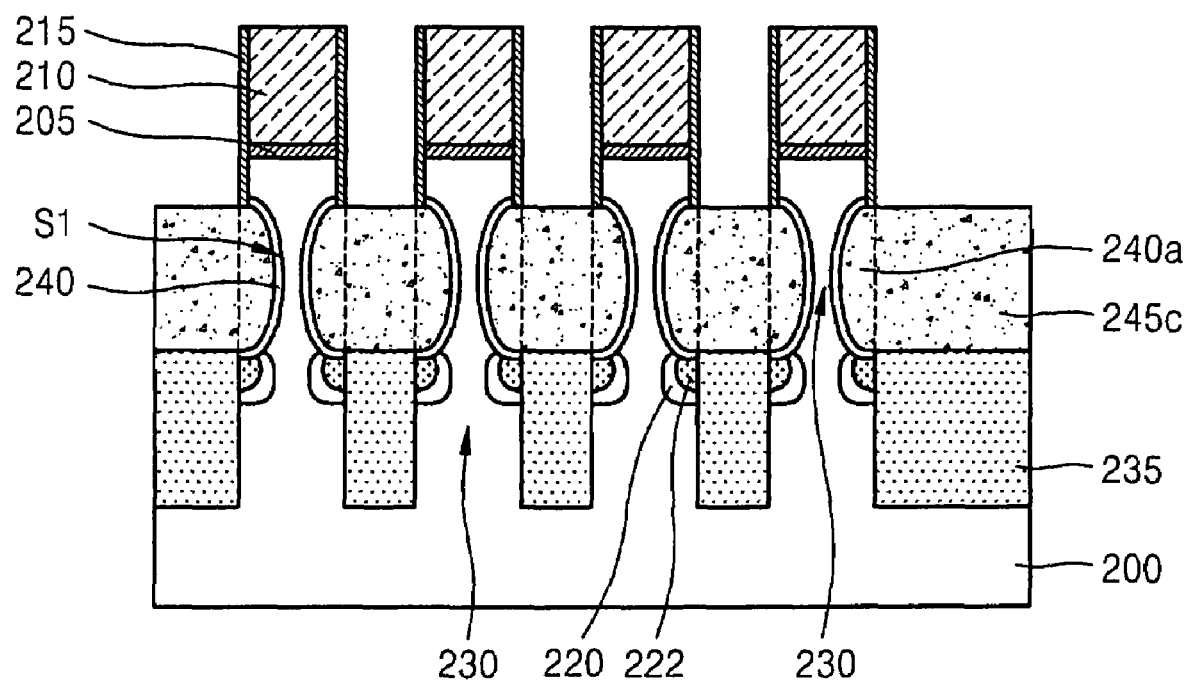

Referring to FIGS. 8B, 9B and 10B, after forming a gate oxide layer 240 on the surface of the exposed active pillar 230, a word line material is formed on second interlayer insulating layer 235 such that it fills predetermined region PW for the word line. Referring now to FIGS. 8B, 9C and 10C, the word line material 245 and the second interlayer insulating layer 235 are etched back to expose first insulating layer 215, but not too far to expose gate insulating layer 240 to integrally form gate electrode 245a and a word line 245c. The subsequent process steps are the same as those of the previously described.

In an alternative embodiment, after preparing the predetermined region PW, word line 245c and gate electrode 245a are integrally formed in predetermined region PW for the word line and a gate region (isotropic space) by a damascene process. Accordingly, there is no contact interface between gate electrode 245a and word line 245c. Although the word line is extended in y-y' direction and the bit line is extended in x-x' direction in the embodiments, it is not limited thereto. In particular, the word line may be extended in x-x' direction and the bit line may be extended in y-y' direction. In addition, both the embedded bit line 150 and bit line 222 formed by a selective scheme may also be utilized in any of the foregoing embodiments.

As described above, a vertical channel transistor including a ring-shaped gate electrode surrounding an outer periphery of an active pillar, and bottom and top source/drain regions disposed under and over the ring-shaped gate electrode, the word line connecting the ring-shaped gate electrodes disposed in the same row or column is integrally formed with the ring-shaped gate electrode. In this manner, no contact interface and no contact resistance between the ring-shaped gate electrode and the word line exists. Accordingly, it is possible to reduce the total resistance of the word line contributing to improved signal transfer characteristics associated with the semiconductor device.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of manufacturing a semiconductor device having a vertical channel, the method comprising:

provide a semiconductor substrate having a plurality of active pillars spaced apart by a predetermined distance in row and column directions;

forming an isotropic space on a predetermined portion of a sidewall of the active pillar;

forming a planarized conductive material layer such that it fills the isotropic space and a space between the active pillars;

forming a word line mask pattern on the planarized conductive material layer and a predetermined portion of the active pillar; and forming a ring-shaped gate electrode in the isotropic space and simultaneously forming a word line by etching the planarized conductive material layer using the word line mask pattern.

2. The method of claim 1, wherein the forming of the plurality of active pillars and the forming of the isotropic space in the active pillar further comprises:

forming hard mask patterns including a pad oxide layer on the semiconductor substrate wherein the hard mask patterns are equally spaced apart in row and column directions;

etching the semiconductor substrate to a first predetermined depth corresponding to the hard mask pattern;

forming a first insulating spacer sidewall of the hard mask pattern and an exposed portion of said semiconductor substrate;

anisotropically etching the semiconductor substrate to a second predetermined depth using the hard mask pattern and the first insulating spacer as a mask, wherein the second predetermined depth is greater than the first predetermined depth; and isotropically etching the sidewall of the exposed semiconductor substrate using the hard mask pattern and the first insulating spacer as a mask to form the isotropic space.

3. The method of claim 2, wherein between the steps of anisotropically etching of the semiconductor substrate and the isotropically etching of the sidewall of the exposed semiconductor substrate, said method further comprising:

implanting impurities into the exposed semiconductor substrate at both sides of the hard mask pattern to form a bottom source/drain region;

forming a conductive line electrically connected to said bottom source/drain region;

etching a predetermined portion of the semiconductor substrate having the bottom source/drain region and the conductive line to separate the active pillars disposed in different rows and simultaneously define a bit line parallel to the row direction;

forming an interlayer insulating layer such that it fills the space between the active pillars; and etching back the interlayer insulating layer to expose the sidewall of the active pillar.

4. The method of claim 1, between the steps of forming the isotropic space and forming the conductive material layer, said method further comprising:

forming a sacrificial gate electrode having a sacrificial gate insulating layer in the isotropic space;

implanting impurities into the exposed portion of the semiconductor substrate at both sides of the sacrificial gate electrode to form a bottom source/drain region;

forming a bit line electrically connected to the bottom source/drain region;

forming an interlayer insulating layer that fills the space between the active pillars;

etching back the interlayer insulating layer to expose side portions of the sacrificial gate electrode; and removing the sacrificial gate electrode.

5. The method of claim 4 wherein between the steps of forming of the bit line and the forming of the interlayer insulating layer, said method further comprising forming a capping layer on respective sidewalls of the hard mask pattern and the sacrificial gate electrode.

6. The method of claim 4, wherein forming of the bit line further comprises:

etching a predetermined portion of the semiconductor substrate including the bottom source/drain region to separate the active pillars disposed in different rows; and forming an embedded bit line by selectively forming a conductive line on the semiconductor substrate which is exposed by the separation of the active pillars.

7. The method of claim 4, wherein the forming of the bit line further comprises:

selectively forming a conductive line in the bottom source/drain region; and etching a predetermined portion of the semiconductor substrate including the bottom source/drain region and the conductive line to separate the active pillars disposed in different rows and simultaneously defining the bit line.

8. The method of claim 4 wherein after the step of forming the sacrificial gate electrode, the method further comprising:

removing the sacrificial gate insulating layer; and forming a gate insulating layer on the surface of the active pillar wherein the isotropic space is formed.

9. The method of claim 8, wherein the word line mask is formed on the active pillars disposed in the same column.

10. The method of claim 9, wherein the word line mask is arranged on at least one column among a plurality of columns, each column being configured with a number of the active pillars.

11. The method of claim 1, wherein the forming of the word line comprises:

anisotropically etching the conductive material layer using the word line mask pattern;

removing the word line mask pattern; and etching back the remaining conductive material layer to a predetermined thickness.

12. The method of claim 11, wherein the step of etching back the remaining conductive material layer, the remaining conductive material layer is etched back such that it is lower than the ring-shaped gate electrode.

13. The method of claim 1, further comprising forming a top source/drain region by implanting impurities over the active pillar.

14. A method of manufacturing a semiconductor device having a vertical channel, the method comprising:

forming a plurality of pillars equally spaced apart and arranged in row and column directions on a semiconductor substrate;

separating the pillars disposed in the respective rows from each other to form active pillars;

filling an interlayer insulating layer into a space between the active pillars;

etching the interlayer insulating layer to a predetermined thickness exposing the plurality of active pillars disposed in the same column;

isotropically etching a sidewall of the exposed active pillar to form an isotropic space;

forming a gate insulating layer on a surface of the active pillar where the isotropic space is formed;

forming a conductive material by damascene process such that the conductive material fills the isotropic space of the active pillar and the space between the interlayer insulating layer and the active pillar; and etching back the conductive material to a predetermined thickness to form a ring-shaped gate electrode and simultaneously forming a word line which is integrally formed with the ring-shaped gate electrode to connect the ring-shaped gate electrodes of the active pillars disposed in the same row.

15. The method of claim 14 wherein between the forming of the active pillar and the separating of the pillars, said method further comprising:

forming a bottom source/drain region on the semiconductor substrate between the active pillar; and forming a conductive line such that it is electrically connected to the bottom source/drain region, wherein the conductive line is etched through the separating of the pillars to define a bit line.

16. The method of claim 14, wherein the etching of the interlayer insulating layer further comprises:

forming a word line mask pattern exposing the active pillar over the interlayer insulating layer;

etching a predetermined portion of the interlayer insulating layer corresponding to a shape of the word line mask pattern; and removing the word line mask pattern.

17. The method of claim 16, wherein the space between the word line mask pattern is greater than the width of the active pillar.

* * * * *